United States Patent
Pietig et al.

(12)

(10) Patent No.: US 10,976,391 B2
(45) Date of Patent: Apr. 13, 2021

(54) HALBACH MAGNET ARRANGEMENT WITH NOTCH

(71) Applicant: Bruker BioSpin GmbH, Rheinstetten (DE)

(72) Inventors: Rainer Pietig, Malsch (DE); Volker Niemann, Ispringen (DE); Lukas Haenichen, Karlsruhe (DE)

(73) Assignee: BRUKER BIOSPIN GMBH, Rheinstetten (DE)

( * ) Notice: Subject to any disclaimer, the term of this patent is extended or adjusted under 35 U.S.C. 154(b) by 3 days.

(21) Appl. No.: 16/693,832

(22) Filed: Nov. 25, 2019

(65) Prior Publication Data

US 2020/0166591 A1 May 28, 2020

(30) Foreign Application Priority Data

Nov. 23, 2018 (DE) ...................... 10 2018 220 170.6

(51) Int. Cl.
| | |
|---|---|
| *G01R 33/383* | (2006.01) |
| *H01F 7/02* | (2006.01) |
| *G01R 33/387* | (2006.01) |

(52) U.S. Cl.
CPC ......... *G01R 33/383* (2013.01); *G01R 33/387* (2013.01); *H01F 7/0278* (2013.01); *H01F 7/0284* (2013.01)

(58) Field of Classification Search
CPC ... H01F 7/0278; H01F 7/0284; G01R 33/383; G01R 33/387
See application file for complete search history.

(56) References Cited

U.S. PATENT DOCUMENTS

| 4,931,760 A | 6/1990 | Yamaguchi et al. |
| 7,148,777 B2 * | 12/2006 | Chell ............... H01F 7/0205 335/306 |

(Continued)

FOREIGN PATENT DOCUMENTS

| EP | 3217186 B1 | 7/2018 |
| EP | 3382412 A1 | 10/2018 |

OTHER PUBLICATIONS

Menzel et al., "Dipolar openable Halbach magnet design for High-Gradient Magnetic Filtration", Separation and Purification Technology 105 (2013) pp. 114-120.

(Continued)

*Primary Examiner* — Ramon M Barrera
(74) *Attorney, Agent, or Firm* — Edell, Shapiro & Finnan, LLC

(57) ABSTRACT

A magnet arrangement having a hollow-cylindrical magnet element that has an axial length $L_{z,M}$ and an inner radius $R_{in}$, is constructed from magnet segments arranged concentrically around the z-axis, and has a Halbach magnetization. At least one ring-shaped magnet element has a notched, hollow-cylindrical cutout extending circumferentially around the z-axis symmetrically with respect to the plane z=0, the axial extent $L_{z,A}$ of the cutout being less than the axial length $L_{z,M}$ of the magnet element. The cutout has a radial depth $T_A$ and an axial length $L_{z,A}<L_{z,M}$ between the z-positions $z=-z_A$ to $z=+z_A$. The radial depth $T_A$ and the axial length $L_{z,A}$ of the cutout are to ensure that the remaining inhomogeneity of the homogenous magnetic field $B_0$ in a predefined measurement volume having an axial plateau length $L_P$ in the center of the magnet arrangement does not exceed 10 ppm.

17 Claims, 20 Drawing Sheets

(56) References Cited

U.S. PATENT DOCUMENTS

| | | |
|---|---|---|
| 10,598,745 B2 | 4/2020 | Haenichen et al. |
| 2010/0013473 A1 | 1/2010 | Blumich et al. |
| 2015/0061680 A1 | 3/2015 | Leskowitz |
| 2017/0254866 A1 | 9/2017 | Haenichen et al. |

OTHER PUBLICATIONS

Bluemich et al., "Small-scale instrumentation for nuclear magnetic resonance of porous media" New Journal of Physics 13 (2011), 16 pages.

* cited by examiner

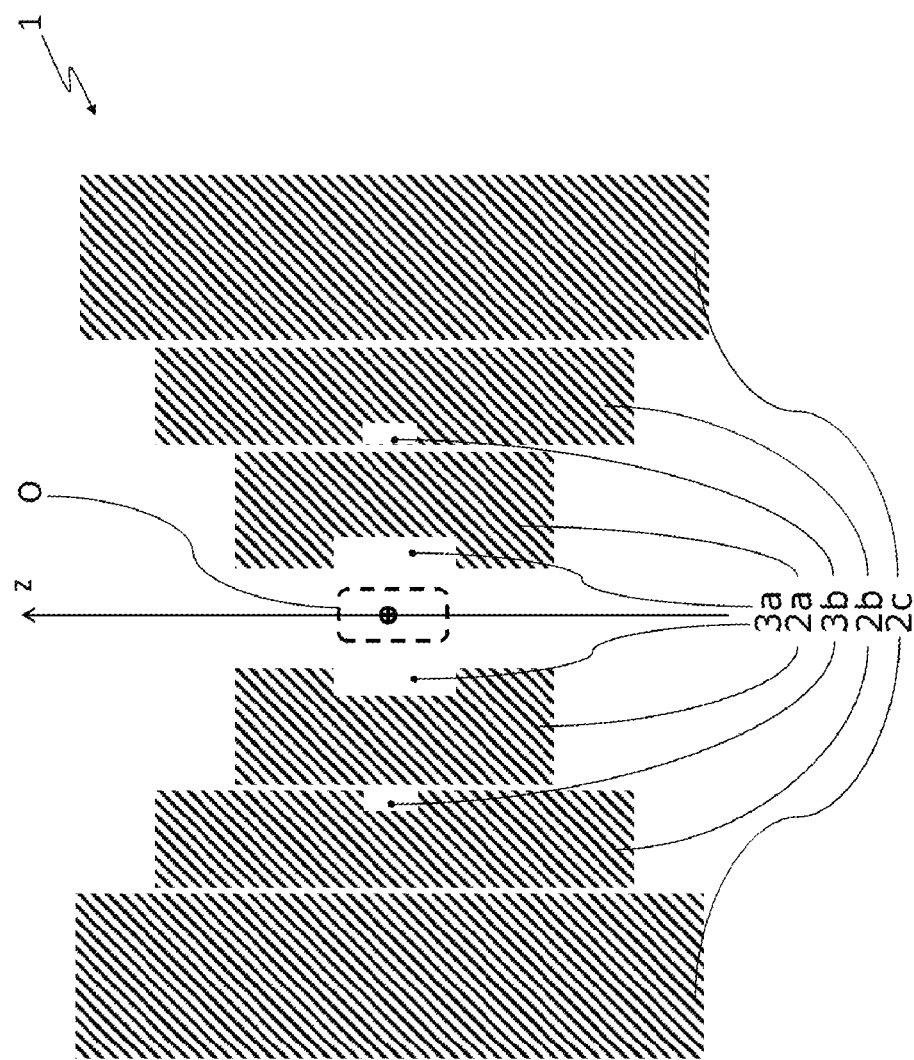

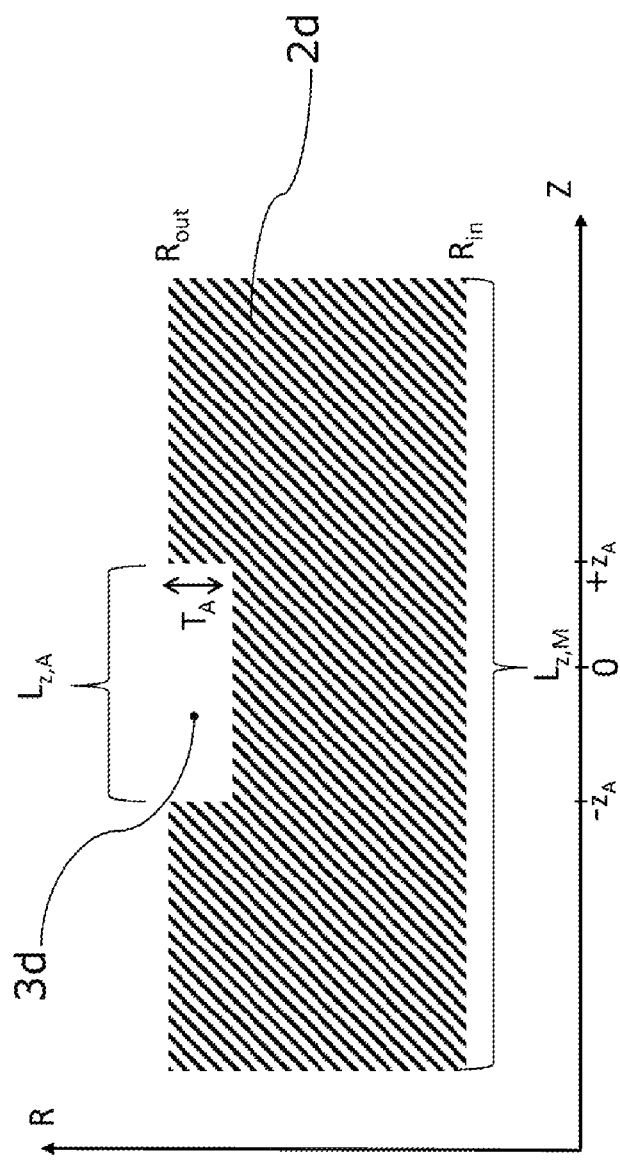

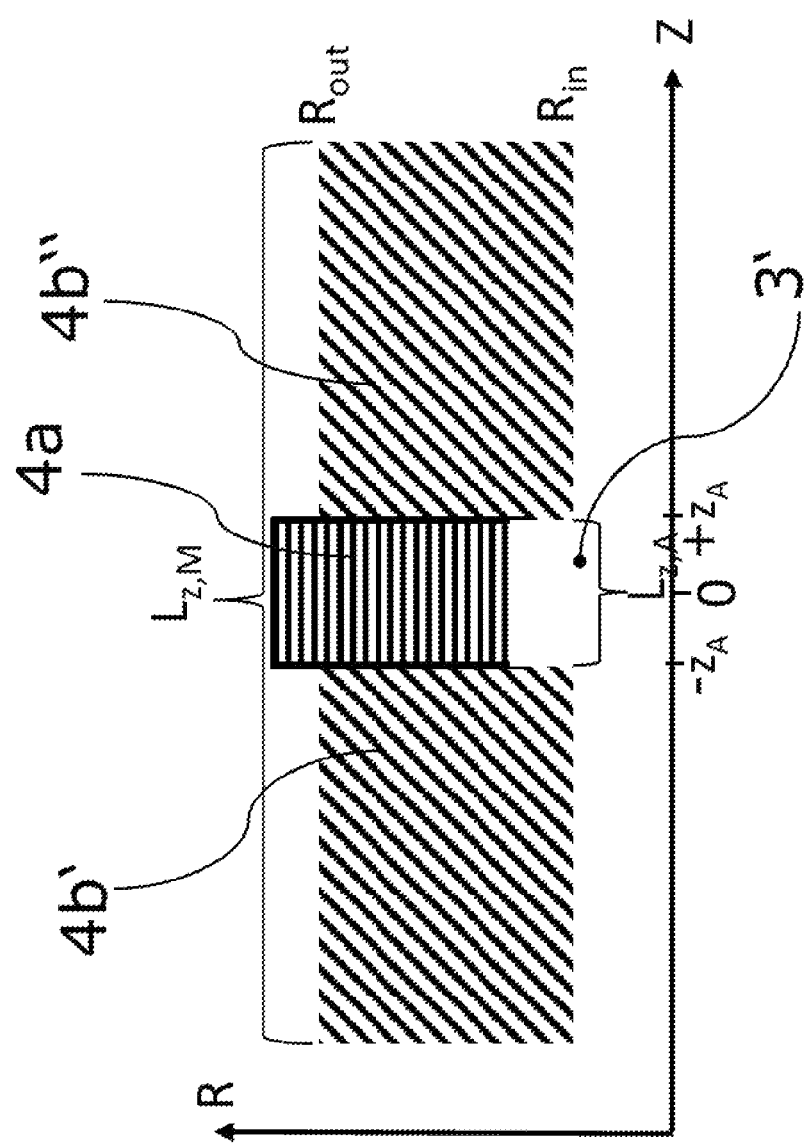

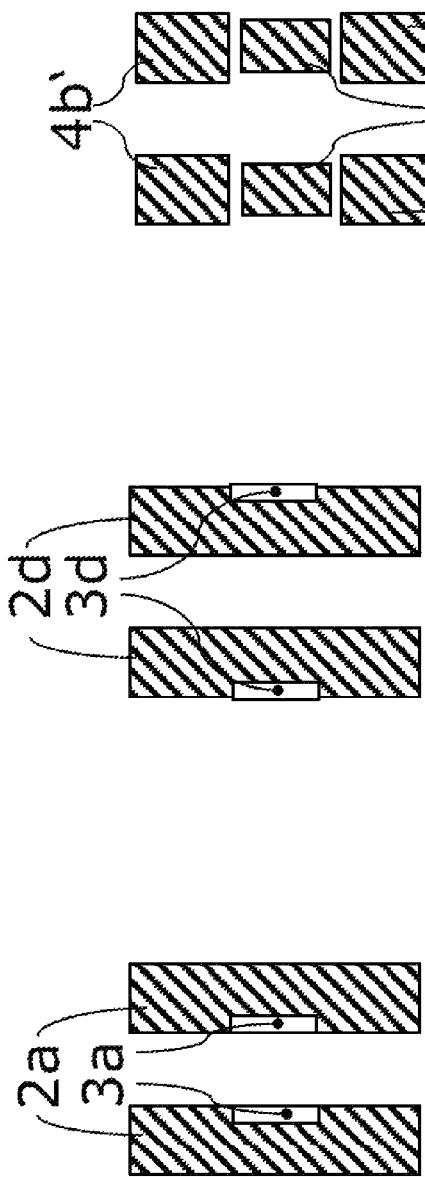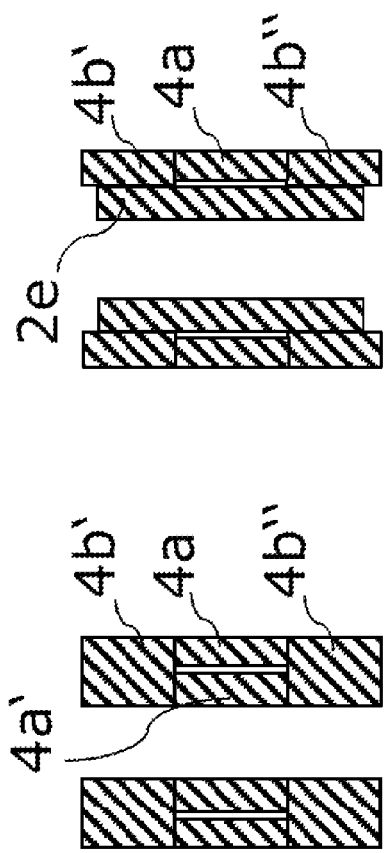

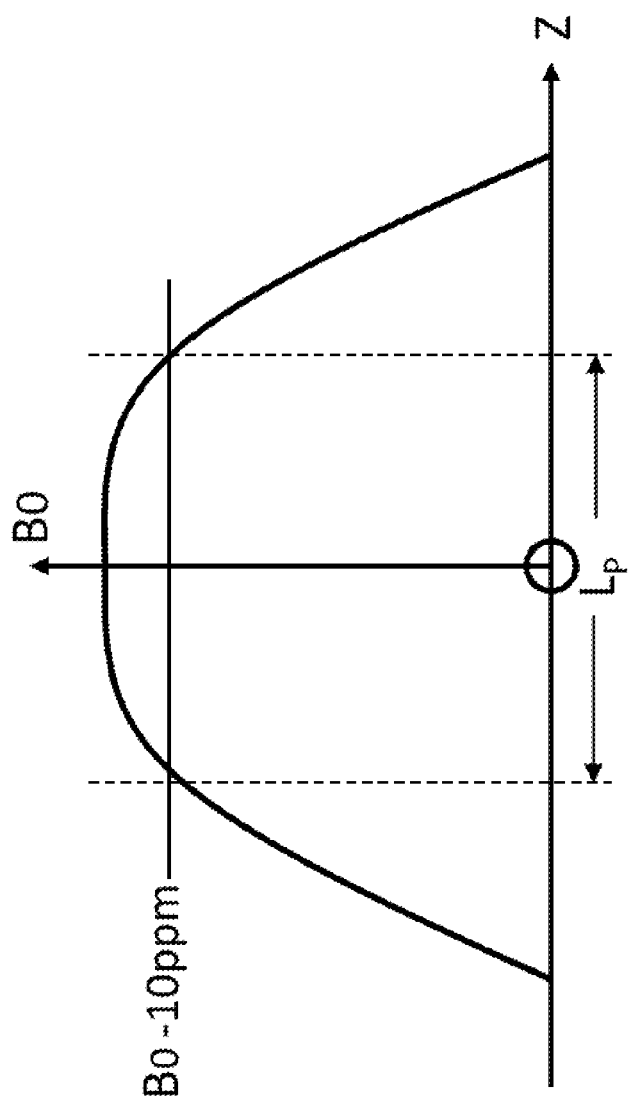

HALBACH MAGNET ARRANGEMENT WITH NOTCH

CROSS REFERENCE TO RELATED APPLICATIONS

This application claims foreign priority under 35 U.S.C. § 119(a)-(d) to German Application No. 10 2018 220 170.6 filed on Nov. 23, 2018, the entire contents of which are hereby incorporated into the present application by reference.

FIELD OF THE INVENTION

The invention relates to a magnet arrangement in a magnetic resonance apparatus having a permanent magnet system for generating a homogeneous magnetic field $B_0$ in a direction perpendicular to a z-axis in a measurement volume, wherein the permanent magnet system comprises at least one hollow-cylindrical ring-shaped magnet element composed of magnetic material having an axial length $L_{z,M}$ and an inner radius $R_{in}$, said magnet element being arranged concentrically around the z-axis, wherein the ring-shaped magnet element is constructed from individual magnet segments and is arranged such that it has a Halbach magnetization that generates a magnetic dipole field.

BACKGROUND

Such a magnet arrangement is known from U.S. Pat. No. 4,931,760 A (=reference [1]) or from US 2010/013473 A1 (=reference [2]).

The present invention relates generally to the field of magnet construction, in particular the design and production of magnet arrangements. Furthermore, the invention is also concerned, however, with the field of magnetic resonance (MR), in particular the provision of permanent magnet systems in a Halbach configuration which are suitable therefor and which are intended for generating homogeneous magnetic fields for NMR measurements. However, the applicability of the invention is not restricted to these fields.

Both in the field of nuclear magnetic resonance (NMR) spectroscopy and in the imaging application (MRI), a very homogeneous magnetic field that is constant over time is required in a sample volume to be defined, which magnetic field can be generated by resistive or superconducting coils or a suitable permanent magnet arrangement. The use of permanent magnets is preferred if flux densities of less than 2 T are sufficient and a comparatively compact construction is desired.

Benchtop NMR apparatuses require an extremely homogeneous magnetic field, which can be generated firstly by a magnet coil arrangement, but also by a permanent magnet arrangement.

A low fringe field permanent magnet arrangement for MR apparatuses having pole shoe and yoke elements for returning and concentrating the magnetic flux with partly segmented, ring-shaped geometry is known for instance from EP 3 217 186 B1 (=reference [3]). However, this is not actually a Halbach configuration of the generic type, but rather a "traditional", closed yoke-based magnet. As guide rails and/or mounting aids, circumferential notches can be provided here on the outer lateral surface of the central drum element.

The yoke-free Halbach design is an entirely different known arrangement, which however can likewise be used for this purpose. The use of ring-shaped permanent magnets having a magnetization as a Halbach dipole is described in the prior art (see, for instance, reference [1] or [2]).

In theory, the high field homogeneity required for NMR measurements can also be achieved using these magnet arrangements, but, precisely in the case of magnet rings in a Halbach configuration, it is very difficult to generate such a homogeneous $B_0$ field. Ring-shaped Halbach dipoles are typically constructed in such a way that individual magnet segments having varying magnetization directions are joined together, the magnetization direction varying in the azimuthal angle.

In order to achieve the field homogeneity demanded for NMR measurements in the measurement volume, in the case of the Halbach magnets, correction mechanisms must be provided in order to be able to compensate for tolerances of the magnet material or of the position of the individual magnet blocks, which complicates the mechanical construction. US 2010/013473 A1 (reference[2]) addresses this subject.

US 2015/0061680 A1 (=reference [4]) describes magnet arrangements and methods for generating magnetic fields. It encompasses magnet arrangements having a plurality of polyhedral magnets which are arranged in a lattice configuration and at least partly enclose a testing volume, wherein the magnet arrangement has an associated magnetic field with a designated field direction. The magnetization direction of the individual polyhedral magnets and the arrangement thereof are such that the resulting magnetic field approximates a Halbach sphere. The field of the basic magnet according to the method described here is generally not homogeneous and is thus unsuitable for MR applications.

US 2010/013473 A1 (=reference [2]), cited in the introduction, proposes an NMR permanent magnet having a Halbach architecture composed of three rings, with a central magnet ring being flanked axially by two head rings. The rings are mutually displaceable in a longitudinal direction with screws or threaded nuts for the purpose of field homogenization. Reference [2] furthermore discloses the fact that the rings consist of individual segments that are alternately trapezoidal and rectangular, wherein the individual segments are displaceable in a radial direction for the purpose of field homogenization. While the bore of the three magnet rings along the z-axis at all points has an identical inner radius $R_{in}$, the outer radius of the central magnet ring is less than that of the two flanking head rings.

Finally, U.S. Pat. No. 4,931,760 A (=reference [1]), likewise already cited in the introduction, also describes a permanent magnet in a Halbach configuration for generating a homogeneous magnetic field in MM instruments. In order to increase the field homogeneity, said reference proposes providing on the outer lateral surface of the ring-shaped magnet element at an axial distance $+z_1$ and $-z_1$ from the plane $z=0$ two cutouts each having a radial thickness $h_2$ smaller than in the rest of the ring. However, said reference does not disclose a notched, hollow-cylindrical central cutout extending circumferentially around the z-axis and arranged symmetrically around the plane $z=0$, and definitely does not disclose a proposal for the concrete dimensioning of such a central notch.

SUMMARY

Against that background, the present invention is based on the object of providing, using the simplest possible technical measures and with no increase in volume, a maximally compact and lightweight permanent magnet arrangement of the type defined in the introduction for an MR apparatus which—for a predefined field strength—generates a region having a particularly homogeneous field distribution over an axial plateau length $L_P$ in the center of the magnet arrangement, wherein the exterior dimensions of the arrangement—that is to say axial length and radial width—and the weight thereof are significantly reduced compared with the known Halbach arrangements.

This object is achieved by the present invention, in a manner that is just as surprisingly simple as it is effective, by virtue of the fact that the ring-shaped magnet element has a notched, hollow-cylindrical cutout extending circumferentially around the z-axis, said cutout being arranged symmetrically with respect to the plane z=0 and the axial extent $L_{z,A}$ of said cutout being less than the axial length $L_{z,M}$ of the ring-shaped magnet element, wherein the circumferential notched cutout of the ring-shaped magnet element has a radial depth $T=T_A$ and an axial length $L_{z,A}<L_{z,M}$ between the z-positions $z=-z_A$ to $z=+z_A$, and the radial depth $T_A$ and the axial length $L_{z,A}$ of the notched cutout are chosen such that the remaining inhomogeneity of the homogeneous magnetic field $B_0$ in a predefined measurement volume having an axial plateau length $L_P$ in the center of the magnet arrangement of the magnetic resonance apparatus does not exceed 10 ppm.

The invention includes arrangements of one or more Halbach rings with the aim of generating a particularly homogeneous magnetic field that is as strong as possible in a predefined measurement volume with as little material as possible being used. A central advantage of the design according to the invention is the extremely simple technical implementation with a central notch, the concrete geometric dimensions of which are calculated individually depending on the required situation on the basis of the specification according to the invention.

In the case of Halbach dipole rings where k=2, besides zonal (axial) also doubly periodic (tesseral) field orders, in principle also occur. For the homogeneity requirements in magnetic resonance applications, it is necessary that, in the region of the measurement volume, both the zonal (=on-axis) and the tesseral (=off-axis) terms vanish or at least become negligible, such that no inhomogeneities occur in the measurement volume.

The remaining inhomogeneities having orders less than or equal to the design order are then attributable to mechanical tolerances and material inhomogeneities and can be corrected using known shim technologies.

Each Halbach ring generally consists of uniform permanent magnet material, which however can be chosen differently for different rings.

PREFERRED EMBODIMENTS AND DEVELOPMENTS OF THE INVENTION

Very particular preference is given to a class of embodiments of the magnet arrangement according to the invention in which the radial depth $T_A$ and the axial length $L_{z,A}$ of the notched cutout are chosen such that an at least 6th-order Halbach magnet arises, that is to say that all zonal field terms N to N≤8 in the measurement volume of the magnetic resonance apparatus along an axial plateau length $L_p$ do not exceed a value of 10 ppm, preferably an 8th-order Halbach magnet, that is to say that all zonal field terms up to N=10 do not exceed a value of 10 ppm. This procedure facilitates a design in line with requirements. This means that weight optimization can be employed in the magnet design since a good homogeneity is achieved with the notched cutout, without the embodiment becoming unnecessarily complex and therefore more expensive than necessary in production.

Surprisingly, with these design criteria of the magnet arrangement according to the invention having a cutout in accordance with this definition, the doubly periodic field orders also become negligible since doubly periodic field orders <N will also not exceed a value of 10 ppm in the measurement volume MV along a plateau radius $R_P$. This property means that no further correction mechanisms are required for these field orders.

Preferably, the magnet arrangement according to the invention comprises only a single circumferential notched cutout at the ring-shaped magnet element. This is possible without any problems and with tenable design complexity.

Further advantageous embodiments are characterized by the fact that the circumferential notched, hollow-cylindrical cutout is embodied as a radially inner notch through a separate central magnet ring having an axial extent $L_{z,A}$ and an inner radius $R_{in}+T_A$, which is flanked axially on both sides in each case by a further magnet ring having an inner radius $R_{in}$. By means of skillful division, the notch thus does not have to be produced by modification of ring assemblies, but rather arises simply as a result of the radial gradation of adjacent ring assemblies. The comparatively low component complexity of the individual ring assemblies (annuli) is thus maintained.

In embodiments of the invention, the magnetization direction of the individual segments in the ring-shaped magnet element can extend substantially parallel in an x-y-plane perpendicular to the z-direction, wherein optionally a planar embodiment of the Halbach arrangement or else optionally a 3-dimensional Halbach magnet can be provided. A 3-dimensional Halbach magnet is characterized by the fact that the magnetization direction of the ring-shaped magnetic elements deviates from the x-y-ring plane in such a way that the component perpendicular to the ring plane with the azimuthal angle of the respective ring-shaped magnet element varies by a tilt angle. By introducing this additional tilt angle for the magnetization direction relative to the x-y-plane, it is possible to reduce further the use of material with the homogeneity remaining the same, that is to say that even more efficient magnet designs are possible.

A further advantageous embodiment provides for a plurality of ring-shaped magnet elements to be arranged concentrically around the z-axis, at least one of which has a notched, hollow-cylindrical cutout extending circumferentially around the z-axis. Such a radial subdivision can afford advantages for production. Moreover, this makes it possible, for example, in the range of relatively small radii, to have recourse to high-coercivity material in order to take account of the higher demagnetization forces.

This embodiment can advantageously be developed by the axial lengths $L_{z,M1 \ldots Mn}$ of the n ring-shaped magnet elements being different, preferably increasing from radially on the inside to radially on the outside. Further geometric degrees of freedom are introduced as a result, which are available for the optimization.

One preferred embodiment of the invention is characterized by the fact that a plurality of ring-shaped magnet elements are arranged in a manner stacked one above another in the z-direction, at least one of which has a notched, hollow-cylindrical cutout extending circumferentially around the z-axis.

In practice, developments of the last two embodiments mentioned have proved worthwhile which are characterized by the fact that at least some of the ring-shaped magnet elements are constructed from different, preferably in each case permanent-magnetic, material, wherein different materials can be present in particular also within an individual ring-shaped magnet element. The magnetic field strength and thus the demagnetization forces are at a maximum in the region near the center. In order to avoid a permanent demagnetization, it is possible to use material having correspondingly higher coercivity where it is required.

Very particular preference is given to embodiments of the invention which comprise a device for homogenizing the magnetic field, preferably a shim tube, for shimming the higher field orders. In this way, the mechanisms described beforehand are supplemented by a further, even more precise instrument for homogenization. Corrections with even finer resolution are thus possible.

Passive shim elements can improve the homogeneity in the interior of the magnet bore, in particular in a shim tube, can be significantly improved. Moreover, an improvement in the homogeneity can also be achieved through electrical shim coils in the interior of the bore.

The scope of the present invention also encompasses a method for calculating a magnet arrangement in accordance with the above-described embodiments or the developments thereof, comprising the following steps:

(a) predefining a minimum inner radius $R_{in}$ of the magnet arrangement, said radius defining the size of the bore, and a smallest non-vanishing zonal field order N, wherein N is a positive even number, and the desired target magnetic field strength of the homogeneous magnetic field $B_0$ in the center of the magnet arrangement;

(b) designing a ring-shaped magnet element as a basic magnet cylinder in a Halbach configuration comprising predefined magnet material of known remanence, having a maximum outer radius $R_{out}$ and an axial length $L_{z,M}$, wherein the ratio of the outer radius $R_{out}$ to the length of the basic magnet cylinder $R_{out}/L_{z,M}$ is from 10:1 to 1:10, preferably 3:1 to 1:3, such that the target magnetic field strength $B_0$ is attained in the center;

(c) detecting the resulting magnetic field profile in the region of the measurement volume (MV) by determining the values of the zonal magnetic field orders of the basic magnet cylinder up to at least the N-th order;

(d) computationally arranging at least one circumferential notched, hollow-cylindrical cutout in the basic magnet cylinder symmetrically with respect to the plane z=0 with a lower remanence and calculating the radial depth $T_A$ and the axial length $L_{z,A}<L_{z,M}$ between the z-positions $z=-z_A$ to $z=+z_A$ and with $L_N$ in such a way that the sum of the zonal magnetic field orders with order less than N vanishes in the case of the basic magnet cylinder modified by the cutout;

(e) adapting the magnetic field strength generated by the modified basic magnet cylinder in the center of the magnet arrangement to the desired magnetic field strength $B_0$ by altering the outer radius $R_{out}$ and/or the axial length $L_{z,M}$ of the basic magnet cylinder.

Designing the magnet element in step (b) is implementable by optimization through computer programs that are customarily available to the person skilled in the art. The ratios $R_{out}:L_M$ are initially first chosen randomly. The detecting in step (c) can be a physical measuring step, although as a rule this is not very practicable. Preference is therefore given to simulation using algorithms—well known especially to those skilled in the art.

Step (d) involves computationally representing the cutout extending circumferentially in a ring-shaped fashion. This notch is defined generally here since it can be produced very simply by omitting magnet material of the basic ring ("full notch") or by adding/replacing a central ring with other magnetic material with lower remanence.

This step (d) can also be performed by available "solver programs". The solver can, given the predefinitions mentioned, design a notch in which the sum of all even zonal orders less than N vanishes.

This results in an extremely advantageous surprising effect: under the condition that a central circumferential region having the same, but negative field order $B_N$ in relation to the basic magnet ring exists in the Halbach ring, the doubly periodic field orders <N in the measurement volume likewise vanish. In this context, however, "vanish" does not mean that the field orders are exactly equal to 0. However, the field orders become so small that they then make only an actually negligible contribution to the total field.

In one advantageous variant of the method according to the invention, in step (e) the field strength $B_{OR}$ resulting from step (d) is detected and the target magnetic field strength $B_0$ in the center of the magnet arrangement is adapted by repeating steps (b) to (d) until $B_{OR}=B_0$. In this way, the optimization calculation proceeds particularly rapidly and extensive parameter studies are made possible.

In a further preferred method variant, in a further method step (f) the ring-shaped magnet element is constructed computationally from at least N+2 circle-arc-shaped magnet segments. This ensures that the higher orders up to and including order N which occur as a result of the segmentation along the circumference are suppressed.

A method variant is also advantageous in which the circumferential notched, hollow-cylindrical cutout is arranged radially on the inside in the basic magnet cylinder, and wherein the outer radius $R_{out,A}$ and the inner radius $R_{in,A}$ of the cutout satisfy the following proportionality condition: $(R_{in,A}+R_{out,A})/(R_{in,A})\sim 1+0.003*((R_{in,A})/(L_P))^N$, wherein $L_P$ denotes the plateau length of the measurement volume (MV) in the center of the magnet arrangement, that is to say the axial extent of the measurement volume (MV). The notch can thus be produced quite simply radial gradation of adjacent ring assemblies with relatively low component complexity.

A further preferred method variant is distinguished by the fact that the circumferential notched, hollow-cylindrical cutout is realized in the basic magnet cylinder in a separate central magnet ring having an axial length $L_{z,A}$ and an inner radius $R_{in}+T_A$, such that the magnet arrangement comprises at least three individual rings arranged coaxially along the z-axis. The higher orders up to and including order N which occur as a result of the segmentation along the circumference can thus be suppressed.

A method variant is likewise preferred in which the circle-arc-shaped magnet segments firstly are adhesively bonded to form fixed individual rings and are stacked one above another in the z-direction and, for further homogenization of the magnetic field, the separate central magnet ring is displaced in an x-y-plane perpendicular to the z-direction. This preassembly to form rigid individual assemblies has considerable advantages inter alia regarding the mechanical robustness and safety of the arrangement.

This variant can also additionally be improved if, for further homogenization of the magnetic field, the axially outer magnet rings are rotated and/or tilted relative to one another about the z-axis. Introducing mechanical actuating mechanisms makes it possible, without any problems, to compensate for disturbing orders which are not of conceptional origin, but rather stem from the shortcomings of production (for instance manufacturing tolerances and fluctuations of the material properties).

Further advantages of the invention are evident from the description and the drawing. Likewise, the features mentioned above and those that will be explained further can be used according to the invention in each case individually by themselves or as a plurality in arbitrary combinations. The embodiments shown and described should not be understood as an exhaustive enumeration, but rather are of exemplary character for outlining the invention.

BRIEF DESCRIPTION OF THE DRAWINGS

The invention is illustrated in the figures and diagrams of the drawing and will be explained in greater detail on the basis of exemplary embodiments.
In the figures:

FIG. 1 shows a schematic spatial vertical sectional view through an embodiment of the magnet arrangement according to the invention having a first radially inner ring-shaped magnet element with circumferential inner notch, a second ring-shaped magnet element with inner notch, which surrounds the first magnet element, and a third magnet element without a circumferential notched cutout, said third magnet element radially surrounding the second magnet element;

FIG. 2B shows a magnet element as in FIG. 2A, but with a radially outer circumferential notched cutout;

FIG. 2C shows a magnet element as in FIG. 2A with a radially inner circumferential notched cutout, but constructed from three sub-rings comprising a central, radially outwardly offset magnet ring flanked on both sides axially by two further magnet rings;

FIG. 3A shows a schematic sectional illustration through both halves of an embodiment having a radially inner circumferential notched cutout as in FIG. 2A;

FIG. 3B shows a schematic sectional illustration through both halves of a magnet element having a radially outer circumferential notched cutout as in FIG. 2B;

FIG. 3C shows a magnet element as in FIG. 2C constructed from three sub-rings, wherein the central sub-ring has a smaller radial wall diameter than the two flanking further sub-rings;

FIG. 4A shows a magnet element composed of three sub-rings in a manner similar to that in FIG. 3C, wherein the central magnet ring is constructed from two concentric rings spaced apart radially from one another;

FIG. 4B shows an embodiment having a magnet element composed of three sub-rings in a manner similar to that in FIG. 3C, but additionally having a further magnet element without a notched cutout, said further magnet element being arranged radially on the inside concentrically with respect to said magnet element;

FIGS. 6A-6C show spatial half-sectional views for illustrating the arising of a simple embodiment of the magnet element according to the invention, as shown in FIGS. 2A and 3A, in which:

FIG. 6A shows an initial magnet ring without notch
FIG. 6B shows a desired notched cutout, and FIG. 6C shows a magnet element with corresponding circumferential, radially inner notched cutout;

FIG. 10 shows the $B_0$ field profile around z=0 with a 6th-order parabola and an axial plateau length $L_P$ in the center of the magnet arrangement where the remaining inhomogeneity does not exceed 10 ppm;

DETAILED DESCRIPTION

Figure 2A:
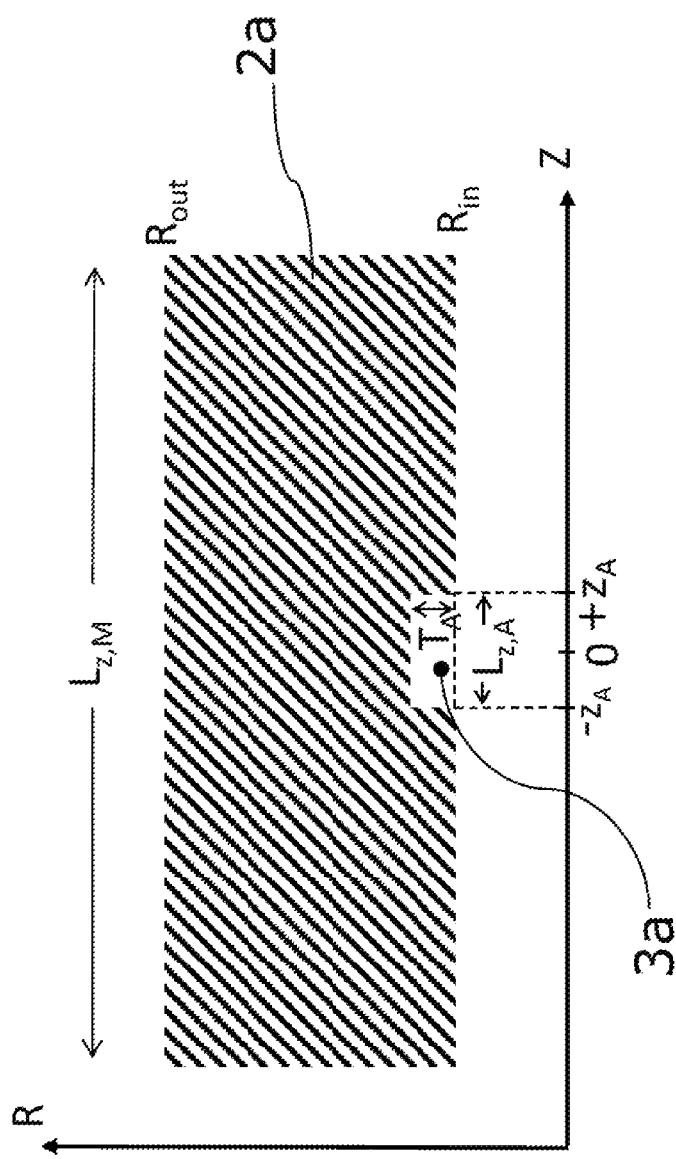
FIG. 2A shows a schematic sectional illustration through one half of a particularly simple embodiment having a magnet element and a radially inner circumferential notched cutout.

The magnet arrangement 1 according to the invention such as is illustrated in each case schematically in various embodiments in the drawing finds its main application as part of a magnetic resonance apparatus—not shown specifically in the drawing—having a permanent magnet system for generating a homogeneous magnetic field $B_0$ in a direction perpendicular to a z-axis in a measurement volume 0, wherein the permanent magnet system comprises at least one hollow-cylindrical ring-shaped magnet element 2a; 2b; 2c; 2d; 2e; 2f'; 2f" composed of magnetic material having an axial length $L_{z,M}$ and an inner radius $R_{in}$, said magnet element being arranged concentrically around the z-axis, and wherein the ring-shaped magnet element 2a-f is constructed from individual magnet segments and is arranged such that it has a Halbach magnetization that generates a magnetic dipole field.

In theory, a Halbach magnet having an infinite axial length and a perfect distribution of the magnetization generates a perfect homogeneous magnetic field. In practice, however, such a Halbach arrangement is constructed from magnet segments of finite length, each of which has a homogeneous magnetization. Such an arrangement indeed generates field inhomogeneities which are partly inherent to the design on account of the finite length of the magnet arrangement and the segmentation of the Halbach ring. In part, however, these inhomogeneities are also attributable to mechanical shortcomings and inhomogeneous properties of the magnetic material used.

The design-intrinsic inhomogeneities arise owing to the fact that the field decreases toward the end of the magnet bore, which brings about a field variation over the length of the measurement sample. In order to minimize this disturbing field variation, the axial length of the Halbach ring has to be chosen to be long enough, but this then necessarily results in a relatively high weight of the entire magnet arrangement. Together with the required magnetic shielding, this causes a high weight and a large structural height of the magnetic resonance apparatus, particularly if a strong magnetic field B>1.8 T is striven for. Moreover, the handling of the measurement sample is no longer comfortable and ergonomic on account of the large structural size of the apparatus.

The present invention therefore proposes creating Halbach rings which achieve from the outset a significantly higher basic homogeneity of the generated magnetic field for a given axial length of the arrangement. This then in turn also results in a considerable reduction of the required structural height and the weight of the permanent magnet system in comparison with the known arrangements discussed in the introduction.

This is achieved according to the invention by virtue of the fact that the ring-shaped magnet element 2a; 2b; 2d has a notched, hollow-cylindrical cutout 3a; 3b; 3d extending circumferentially around the z-axis, said cutout being arranged symmetrically with respect to the plane z=0 and the axial extent $L_{z,A}$ of said cutout being less than the axial length $L_{z,M}$ of the ring-shaped magnet element 2a; 2b; 2d, wherein the circumferential notched cutout 3a; 3b; 3d of the ring-shaped magnet element 2a; 2b; 2d has a radial depth $T=T_A$ and an axial length $L_{z,A}<L_{z,M}$ between the z-positions $z=-z_A$ to $z=+z_A$. The radial depth $T_A$ and the axial length $L_{z,A}$ of the notched cutout 3a; 3b; 3d are chosen such that the remaining inhomogeneity of the homogeneous magnetic field $B_0$ in a predefined measurement volume 0 having an axial plateau length $L_P$ in the center of the magnet arrangement 1 of the magnetic resonance apparatus does not exceed 10 ppm.

The permanent magnet system according to the invention can also have a plurality of ring-shaped magnet elements 2a; 2b; 2c; 2d; 2e. In the embodiment shown in FIG. 1, for instance, said ring-shaped magnet elements are arranged concentrically around the z-axis. In this case, at least one of said magnet elements must always have a notched, hollow-cylindrical cutout 3a; 3b; 3d extending circumferentially around the z-axis. This is the case for the radially innermost magnet element 2a and the second innermost magnet element 2b in the embodiment in accordance with FIG. 1.

At least some of the ring-shaped magnet elements 2a; 2b; 2c; 2d; 2e; 2f'; 2f" can be constructed from different, preferably in each case permanent-magnetic, material, wherein different materials can be present in particular also within an individual ring-shaped magnet element 2a; 2b; 2c; 2d; 2e; 2f'; 2f".

One particularly simple embodiment is illustrated in FIG. 2A. Here the magnet element 2a consists merely of a background ring defined by its inner radius $R_{in}$ and its outer radius $R_{out}$ and its axial length $L_{z,M}$. The magnet element 2a has a radially inner notched recess 3a defined by its axial notch length $L_{z,A}$ between the z-positions $z=-z_A$ to $z=+z_A$ and by its radial depth $T_A$. FIG. 2A shows a sectional drawing of such a magnet ring, only one half thereof being visible. This is a preferred embodiment since here the notch can be given particularly small dimensions and larger material losses that would result in a lower total field strength thus do not arise.

The further the distance from the ROI ("Region of Interest", or measurement volume) for positioning the notch, the larger the dimensioning of the notch must be in order that it satisfies the criteria that the low field orders <N vanish.

FIG. 2B schematically shows a magnet element 2d in which the notched cutout 3d is provided radially on the outside of the basic magnet ring with respect to the ROI.

In order to simplify the production of a magnet arrangement according to the invention, it is also possible to adopt a procedure such that the recess is produced in the magnet element by the basic magnet being split into three individual rings in the longitudinal direction along the z-axis or even being constructed from three such individual rings in the first place, wherein the length of the axially central ring corresponds exactly to the—previously calculated—axial length $L_{z,A}$ of the notched cutout. Said axially central ring can then be displaced radially as far as the desired outer radius of the notch.

Such an embodiment is illustrated schematically in FIG. 2C. In this case, the circumferential notched, hollow-cylindrical cutout 3' is embodied as a radially inner notch through a separate central magnet ring 4a having an axial extent $L_{z,A}$ and an inner radius $R_{in}+T_A$. Said central magnet ring 4a is flanked axially on both sides in each case by a further magnet ring 4b', 4b" having an inner radius $R_{in}$. Optionally, the central ring can also have a larger radius. That then results in a gain in total field strength, but might obstruct other components or further individual rings arranged radially further out.

FIG. 3A shows both halves of a magnet element 2a with a radially inner circumferential notched cutout 3a in a manner similar to that in FIG. 2A.

FIG. 3B shows both halves of a magnet element 2d having a radially outer circumferential notched cutout 3d in a manner similar to that in FIG. 2B.

FIG. 3C shows a magnet element constructed from three sub-rings comprising a central, radially inwardly offset magnet ring 4a flanked on both sides axially by two further magnet rings 4b', 4b", wherein the central sub-ring 4a has a smaller radial wall diameter than the two flanking further sub-rings 4b', 4b".

FIG. 4A shows a further magnet element composed of three sub-rings in a manner similar to that in FIG. 3C, wherein the central magnet ring is constructed from two coaxial rings 4a, 4a' which are spaced apart radially from one another and thus enclose a circumferential notched gap between them.

FIG. 4B shows an embodiment having a magnet element composed of three sub-rings 4a, 4b', 4b" in a manner similar to that in FIG. 2C or 3C, but additionally having a further magnet element 2e without a notched cutout, said further magnet element being arranged radially on the inside concentrically with respect to said magnet element. The central magnet ring 4a is spaced apart radially from the magnet element 2e and thus encloses a circumferential notched gap between the central magnet ring 4a and the further magnet element 2e.

Figure 5:
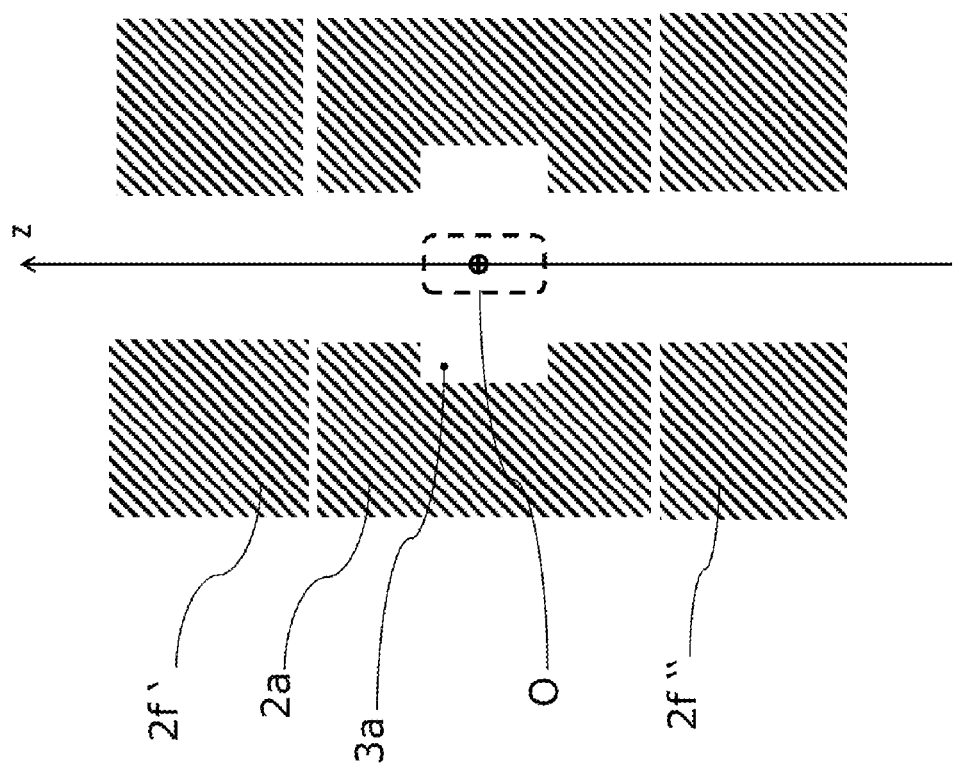
FIG. 5 shows an embodiment having three magnet elements stacked axially one above another, only the central one of which has a circumferential, radially inner notched cutout.

FIG. 5 illustrates an embodiment having three magnet elements 2a, 2f', 2f'' stacked axially one above another, only the central magnet element 2a of which has a radially inner notched cutout 3a extending circumferentially around the z-axis.

Figure 6A:
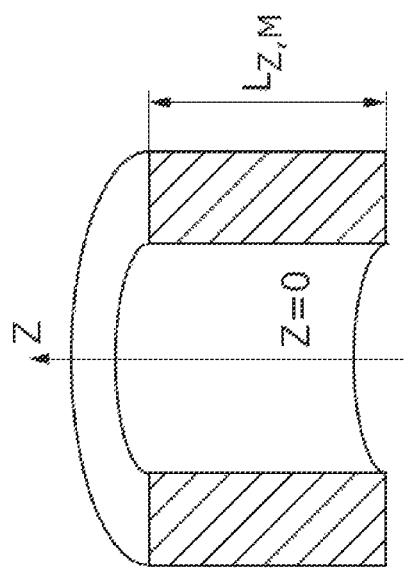
Figure 6B:
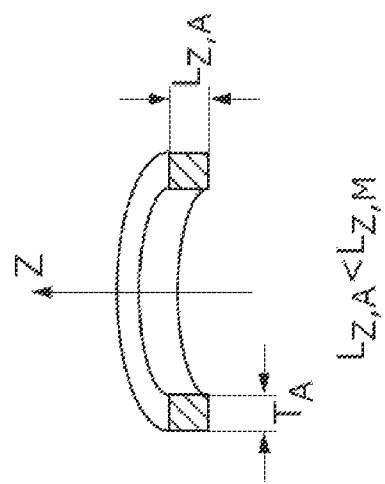
Figure 6C:
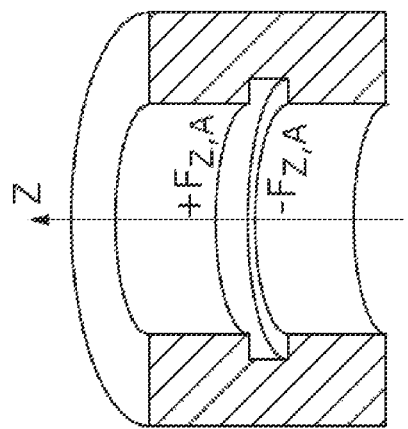

The spatial half-sectional views shown in FIGS. 6A-6C serve for illustrating the arising of a simple embodiment of the magnet element according to the invention, as illustrated for instance in FIGS. 2A and 3A. What is initially taken as a basis is a simple Halbach magnet ring without a notch, said magnet ring having an axial length $L_{z,M}$. The desired notched cutout—calculated beforehand by a design program—in the form of a smaller ring having the axial length $L_{z,A} < L_{z,M}$ is then separated from said magnet ring. A magnet element according to the invention having a corresponding circumferential, radially inner notched cutout arises in this way.

Figure 7B:
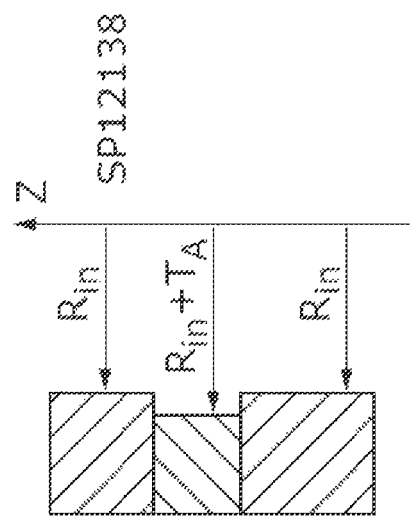
FIG. 7A shows a spatial half-sectional view and
FIG. 7B shows an associated vertical sectional view for illustrating the construction of an embodiment of the magnet element according to the invention composed of 3 sub-rings in a manner similar to the embodiments shown, respectively, in FIGS. 2C and 3C.
Figure 7A:
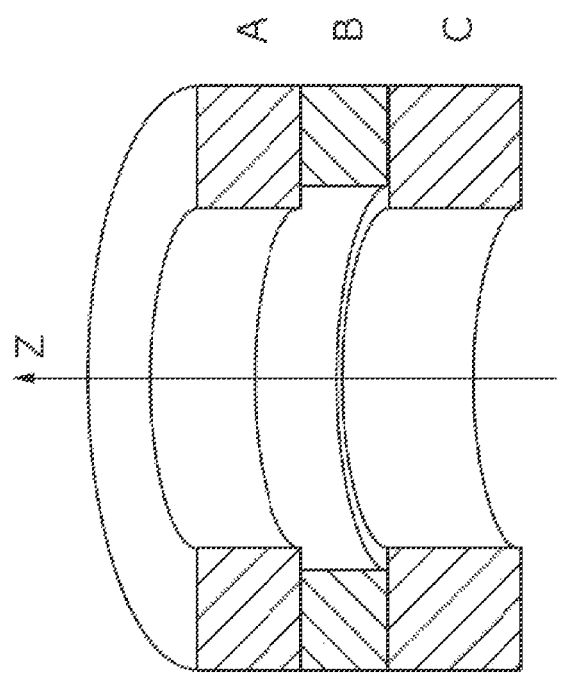

The spatial half-sectional view in FIG. 7A and its associated vertical sectional view in FIG. 7B serve for illustrating the construction of an embodiment of the magnet element according to the invention composed of three sub-rings in a manner similar to the embodiments in FIGS. 2C and 3C.

Figure 8A:
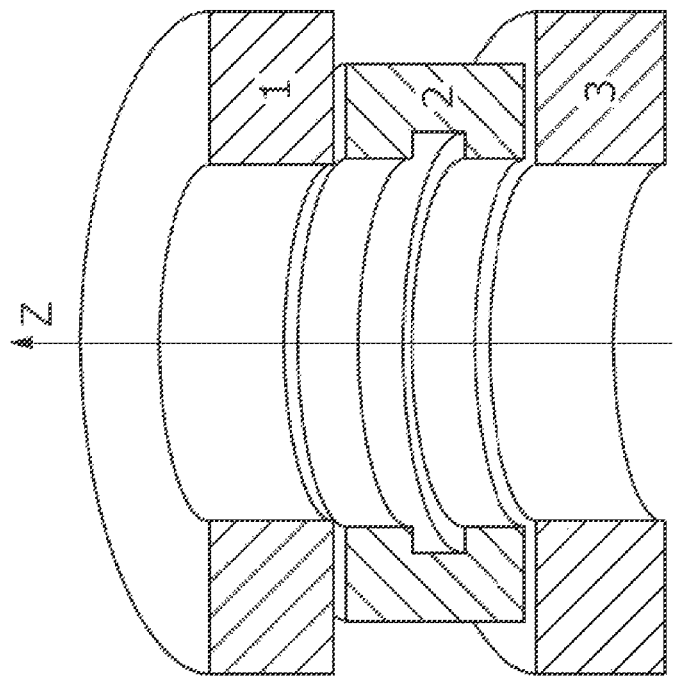
FIG. 8A shows a spatial half-sectional view through an embodiment similar to that in FIG. 5.

FIG. 8A illustratively shows a spatial half-sectional view through an embodiment similar to that in FIG. 5.

Figure 8B:
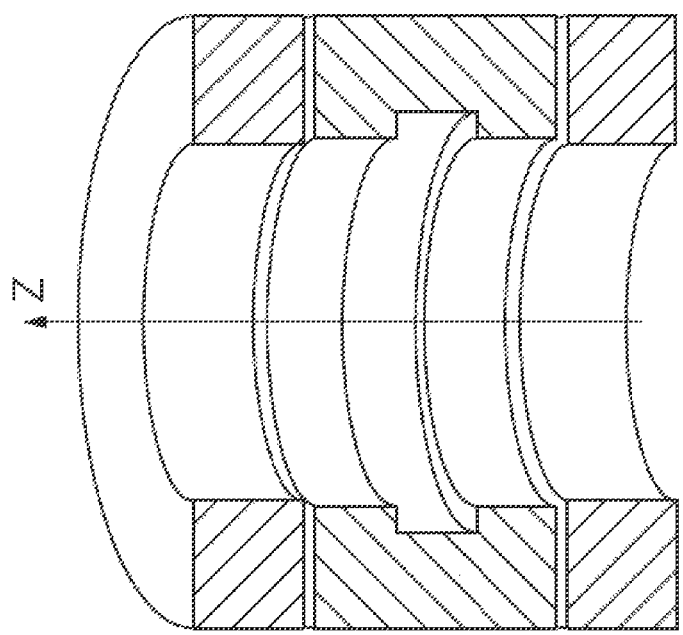
FIG. 8B shows a spatial half-sectional view through an embodiment similar to that in FIG. 8A, wherein the central magnet element having a radially inner notched cutout has a smaller outer radius than the two axially flanking magnet elements without notches.

FIG. 8B illustrates an embodiment similar to that in FIG. 8A, in which embodiment, however, the centrally situated axially central magnet element having a radially inner notched cutout has a smaller outer radius than the two axially flanking magnet elements without notches. This measure serves for further homogenization of the magnetic field in the measurement volume and for additional saving of material and thus reduction of weight.

Figure 9:
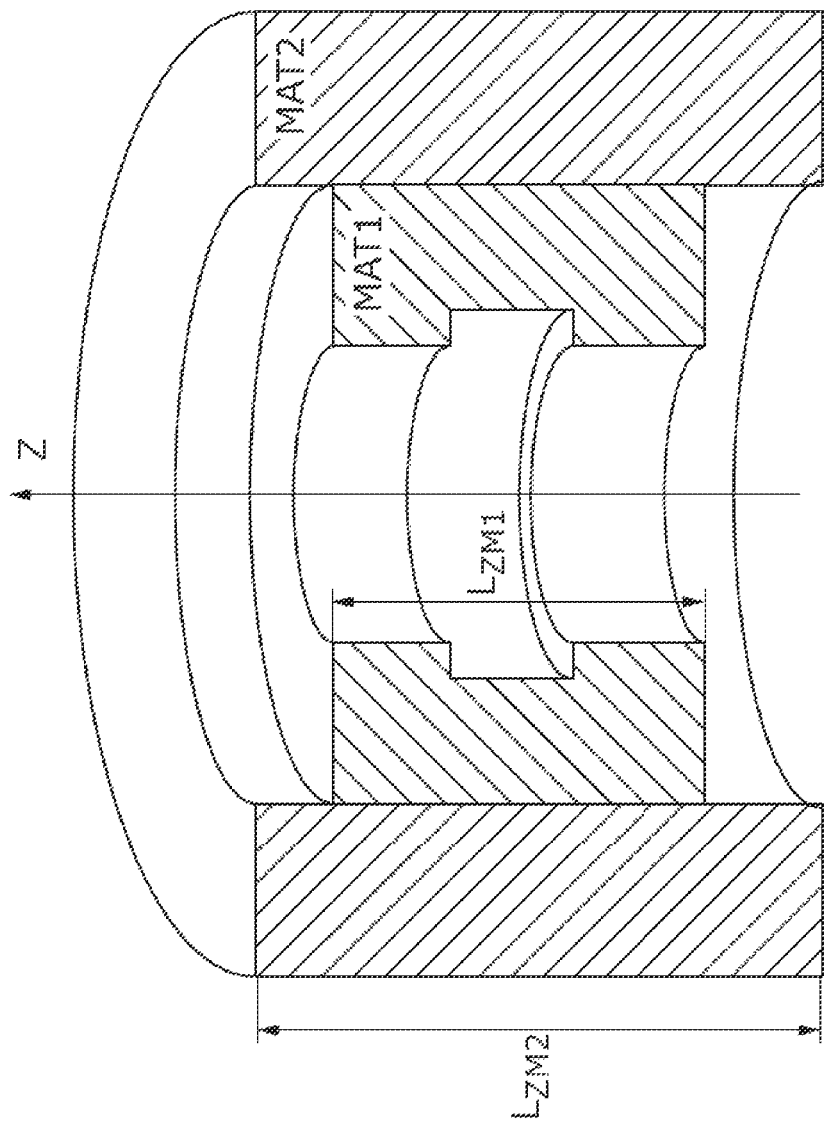
FIG. 9 shows a spatial half-sectional view through an embodiment of a magnet element with a radially inner notched cutout similar to that as shown in FIGS. 2A and 3A, but additionally with a further magnet element arranged radially on the outside without a notch.

FIG. 9 illustrates, as a spatial half-sectional view, a further embodiment of the magnet element according to the invention having a radially inner notched cutout in a manner similar to that in FIGS. 2A and 3A, but additionally having—arranged radially around that—a magnet element without a notch and having a greater axial length.

In principle it holds true for all embodiments of the magnet arrangement according to the invention that the circumferential cutout can be embodied as a so-called "full notch", that is to say around a recess in the background ring. However, the cutout can also be formed by a region having reduced remanence, wherein the recess is filled with a different magnet material, for example.

In principle, a cutout throughout is also conceivable. This then results in only two mirror-inverted rings in a "Helmholtz arrangement". In the procedure for calculating the cutout, both embodiments are similar: firstly, a background ring having a desired remanence is defined. The cutout, which is nothing more than an "inverse ring" in the computation process, is then subtracted from said background. If a "full notch" is involved, then a corresponding ring having the same remanence as the background ring has to be subtracted computationally. If a ring comprising a different magnet material than the basic ring is involved, then a corresponding ring having the "difference remanence"—that is to say remanence of the background ring minus remanence of the cutout—has to be subtracted. The difference for the respective field order must be negligible at the end of the calculation. The field orders are regarded as negligible if they become smaller than a self-defined value. If a 10 ppm profile length of 22 mm is set, for example, then the n-th field order contributes with $10^6 * B_n/B_0 * (11 \text{ mm})_n$ ppm. If this value is less than 10 ppm, then the corresponding field order can be addressed as "negligible".

The $B_0$ field along a useful volume $L_P$ (=plateau length) in the center of the magnet is deemed to be (sufficiently) homogeneous if the field changes in the z-direction deviate not more than 10 ppm, as is illustrated in FIG. 10, which shows the $B_0$ field profile around z=0 with a 6th-order parabola and an axial plateau length $L_P$ in the center of the magnet arrangement where the remaining inhomogeneity does not exceed 10 ppm.

These homogeneity requirements are usually satisfied if a 6th-order (N=8) Halbach magnet ring is constructed and is provided with a circumferential recess according to the invention. For higher-order, for example 8th-order (N=10), magnets, it is advantageous to provide at least two recesses. A further recess increases the degrees of freedom in design and manufacture. Retaining only one recess necessitates significant precision during manufacture which in turn constitutes additional expenditure. Preferably, three concentrically arranged basic rings are also used for this permanent magnet arrangement (see, for instance, the embodiment from FIG. 1).

Exemplary Embodiment 1

Magnet having a 10 ppm profile length of 22 mm in the ROI

Figure 11A:
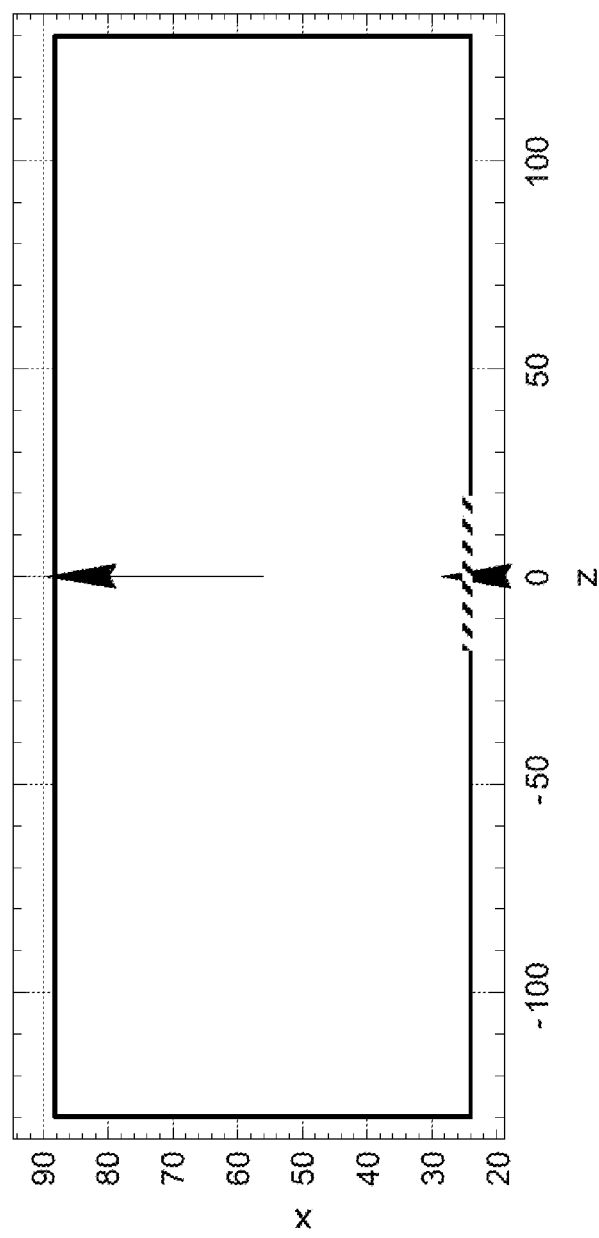
FIG. 11A shows a schematic vertical half-sectional view along the z-axis through a magnet element in accordance with exemplary embodiment 1.

The design of such a magnet composed of Nd—Fe—B is optimized with respect to a 10 ppm region extending over 22 mm in the z-direction relative to the center of the magnet. A sectional drawing of one half of the magnet in the x-z-plane can be seen in FIG. 11A. The notch is illustrated in a hatched manner and arranged centrally relative to z=0. The x-axis should be equated with the radius of the magnet element in this illustration. The z-axis of the arrangement here extends from −130 mm to +130 mm.

The predefinitions in the design of this magnet are the resulting field strength $B_0$ in the ROI, the inner radius $R_{in}$ and the requirement that the 10 ppm region is intended to extent over at least 22 mm. A notched recess extending axially from the center at z=0 in the z-direction and radially with an outer radius $R_N$ is also defined. Furthermore, the field orders N<8 are intended to become minimal.

In order to restrict the parameters somewhat in order that the solver program yields meaningful results, it is possible also to input a possible length $L_M$ of the magnet. The solver then yields a numerical approximate solution for the dimension of the magnet and of the notch.

The dimensions of the magnet ring are indicated in the table below. The axial field orders calculated here are negligibly small. What is surprising, in particular, is that the doubly periodic terms also become vanishingly small.

| Parameter | Ring | Notch |
|---|---|---|
| $B_0$ [T] | 1.8 | |
| $R_{in}$ [mm] | 24 | 24 |
| $R_{out}$ [mm] | 88.2593 | |
| $R_n$ [mm] | | 24.112 |
| $L_M$ [mm] | 259.802 | |
| $L_N$ [mm] | | 35.5198 |
| Mass [g] | 44153.8 | |

Gradient of the overall magnet:

Axial [(T/m)$^N$]:

| | |
|---|---|
| $B_0$ | 1.8 |
| $B_2$ | $-4.60786 \times 10^{-19}$ |
| $B_4$ | $1.42895 \times 10^{-22}$ |
| $B_6$ | $-9 \times 10^{-12}$ |

Doubly periodic [(T/m)$^N$]:

| | |
|---|---|
| $B_{22}$ | $3.84341 \times 10^{-20}$ |
| $B_{42}$ | $-4.76275 \times 10^{-24}$ |
| $B_{62}$ | $1.60714 \times 10^{-13}$ |

Figure 11B:
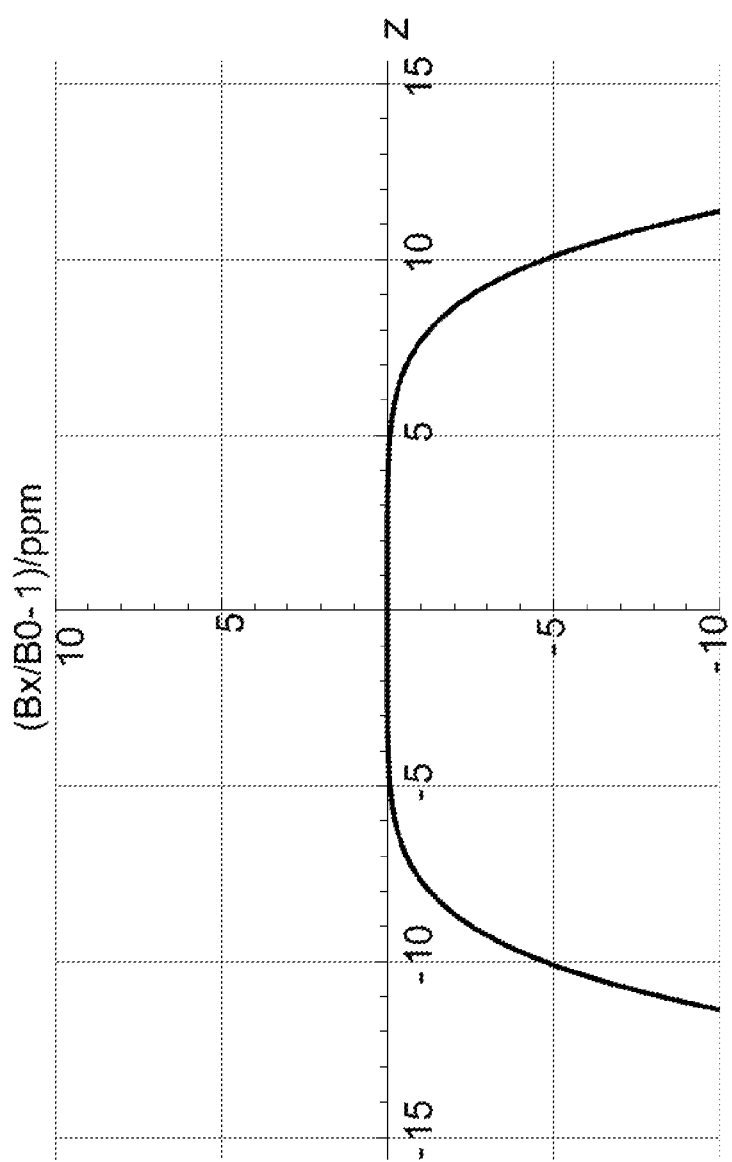
FIG. 11B shows the plateau region of exemplary embodiment 1 from FIG. 11A.

The graph in FIG. 11B clearly reveals that the 10 ppm region extends axially over more than 22 mm in the z-direction.

Exemplary Embodiment 2

Weight-optimized magnet having a field strength of $B_0=1.8$ T

The design of this magnet composed of Nd—Fe—B is optimized with respect to minimizing the magnet weight given the same field strength as in exemplary embodiment 1, but a compromise was made with regard to the 10 ppm region, which now extends axially only over approximately 15 mm in the z-direction relative to the center of the magnet at z=0.

Figure 12A:
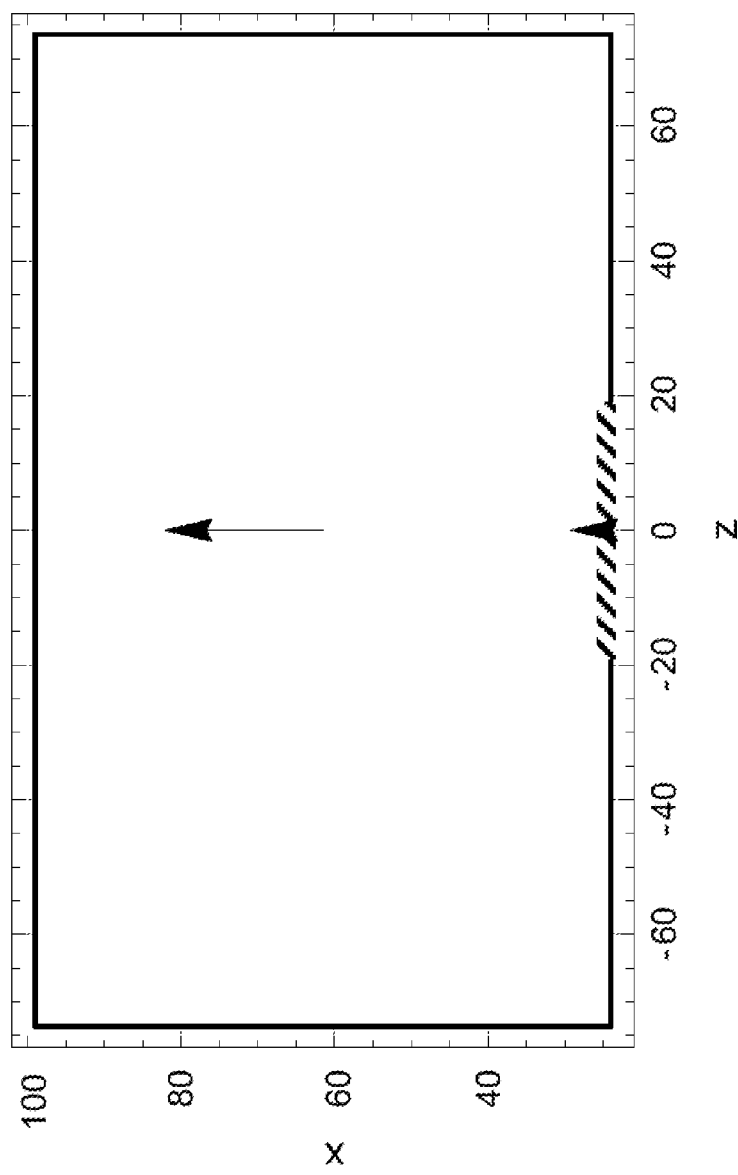
FIG. 12A shows a schematic vertical half-sectional view along the z-axis through a magnet element in accordance with exemplary embodiment 2.

A sectional drawing in the xz-plane of one half of the magnet element can be seen in FIG. 12A. The notch is once again illustrated in a hatched manner and arranged centrally around z=0. The x-axis should be equated with the radius of the magnet element in this illustration. The z-axis here extends from −75 mm to +75 mm.

The predefinitions in the design of this magnet are the resulting field strength $B_0$ in the ROI, the inner radius $R_{in}$ and the requirement that the weight is intended to become minimal. A notch extending axially from the center at z=0 in the z-direction and radially with an outer radius $R_N$ is also defined. Furthermore, the field orders N<8 are intended to become minimal. The length of the 10 ppm region is not the main focus here.

The narrowing of specific parameters such as the length $L_M$ of the magnet is possible here as well. The solver then yields a numerical approximate solution for the dimension of the magnet and of the notch.

The dimensions and gradients of the resulting magnet ring are listed in the table below. What is surprising here, too, once again is that the doubly periodic terms become vanishingly small.

| Parameter | Ring | Notch |
|---|---|---|
| $B_0$ [T] | 1.8 | |
| $R_{in}$ [mm] | 24 | 24 |
| $R_{out}$ [mm] | 99.027 | |
| $R_n$ [mm] | | 25.337 |
| $L_M$ [mm] | 147.2234 | |
| $L_N$ [mm] | | 37.1538 |
| Mass [g] | 31961.1 | |

Gradient of the overall magnet:

Axial [(T/m)$^N$]:

| | |
|---|---|
| $B_0$ | 1.8 |
| $B_2$ | $-5.42101 \times 10^{-20}$ |
| $B_4$ | $1.43929 \times 10^{-22}$ |
| $B_6$ | $-8.67116 \times 10^{-11}$ |

Doubly periodic [(T/m)$^N$]:

| | |
|---|---|
| $B_{22}$ | $5.0822 \times 10^{-21}$ |
| $B_{42}$ | $-4.80799 \times 10^{-24}$ |
| $B_{62}$ | $1.54842 \times 10^{-12}$ |

Figure 12B:
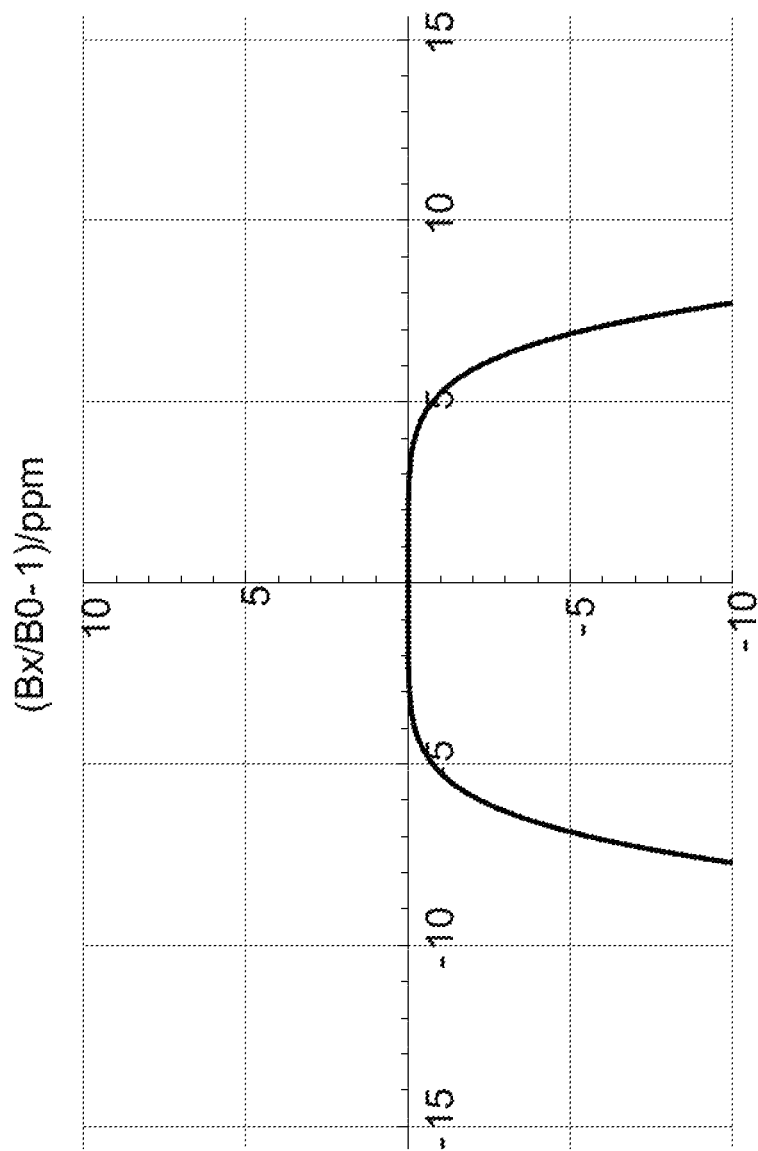
FIG. 12B shows the plateau region of exemplary embodiment 2 from FIG. 12A.

The graph in FIG. 12B clearly reveals that the 10 ppm region is smaller than in exemplary embodiment 1.

The graphs in FIGS. 13A-13E are based on the assumption of a minimal embodiment, that is to say a hollow-cylindrical HALBACH magnet having a central, inner notch in accordance with FIG. 2A. In this case, length variables are normalized to the bore radius $R_i$, and volume variables are normalized to the third power of the bore radius. The abscissas in graphs 13A-13E represent the normalized plateau length $L_p/R_{in}$, that is to say the required length section of the z-axis (bore axis) on which the field deviation from the nominal value $B_0$ is less than 10 ppm ($L_p$) divided by the previously defined bore radius ($R_{in}$). The families of curves, with the remanence as family parameter, represent a measure of the magnetic flux density in the sample volume relative to the remnant flux density of the rare earth material used.

Figure 13A:
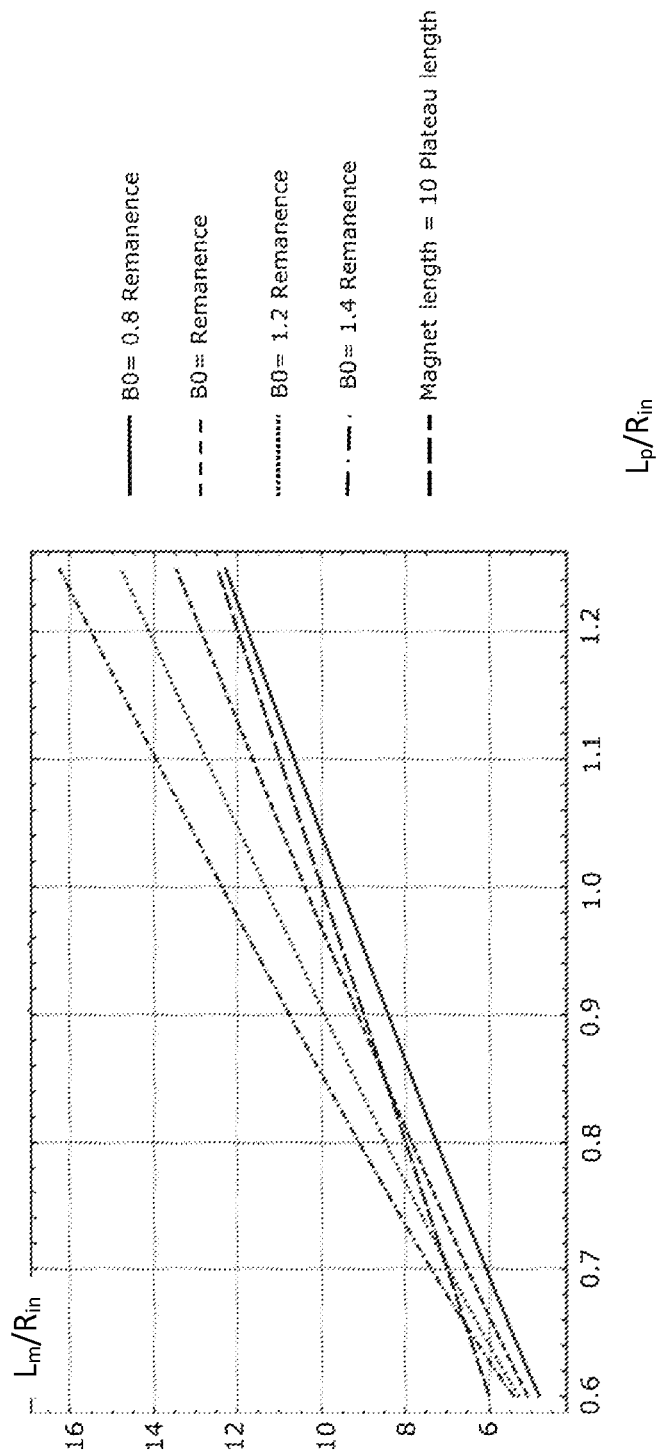
FIG. 13A shows the normalized magnet length $L_M/R_{in}$ as a function of the normalized plateau length $L_p/R_{in}$ in the case of a simple embodiment having a single magnet element having an inner notch for illustrating the field dependence in the case of various remanences.

FIG. 13A firstly shows the normalized magnet length $L_m/R_{in}$ as a function of the normalized plateau length $L_p/R_{in}$. Example: With a rare earth material having the remanence Br=1.4 T and a required flux density of $B_0$=1.4 T, the line "$B_0/B_r=1$" is obtained. In accordance with the requirement for a plateau length of $L_p$=12 mm, for example, and a bore radius of $R_{in}$=15 mm, a normalized plateau length of 0.8 is obtained. Accordingly, the normalized magnet length can be indicated to a first approximation as 8, that is to say that the magnet would have to have eight times the length of the bore radius. It is thus possible already to provide first points of reference for the space requirement.

Figure 13B:
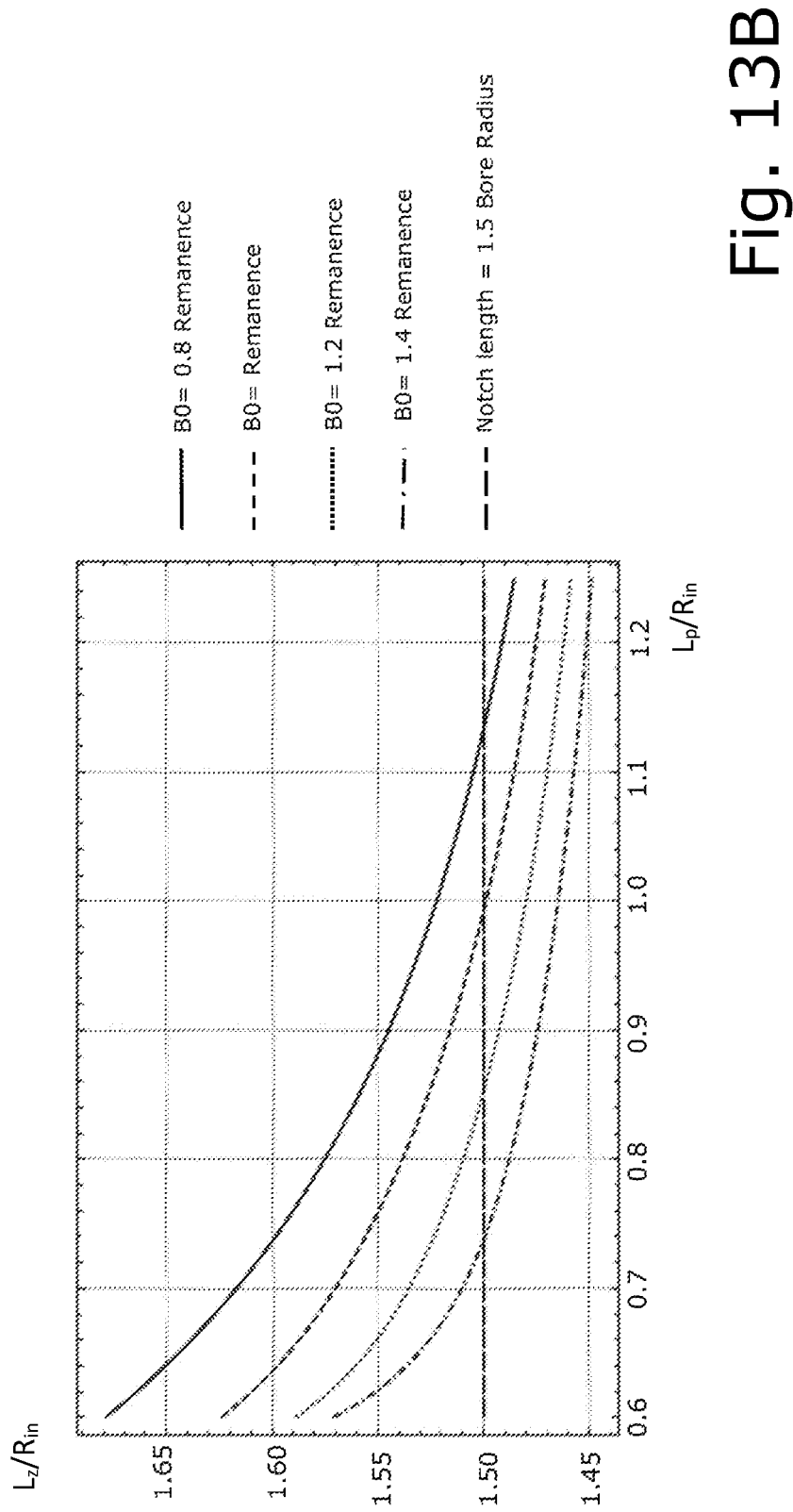
FIG. 13B shows the normalized notch length $R_z/R_{in}$ as a function of the normalized plateau length $L_p/R_{in}$ for illustrating the weak dependencies of field and plateau length in the case of various remanences.
Figure 13C:
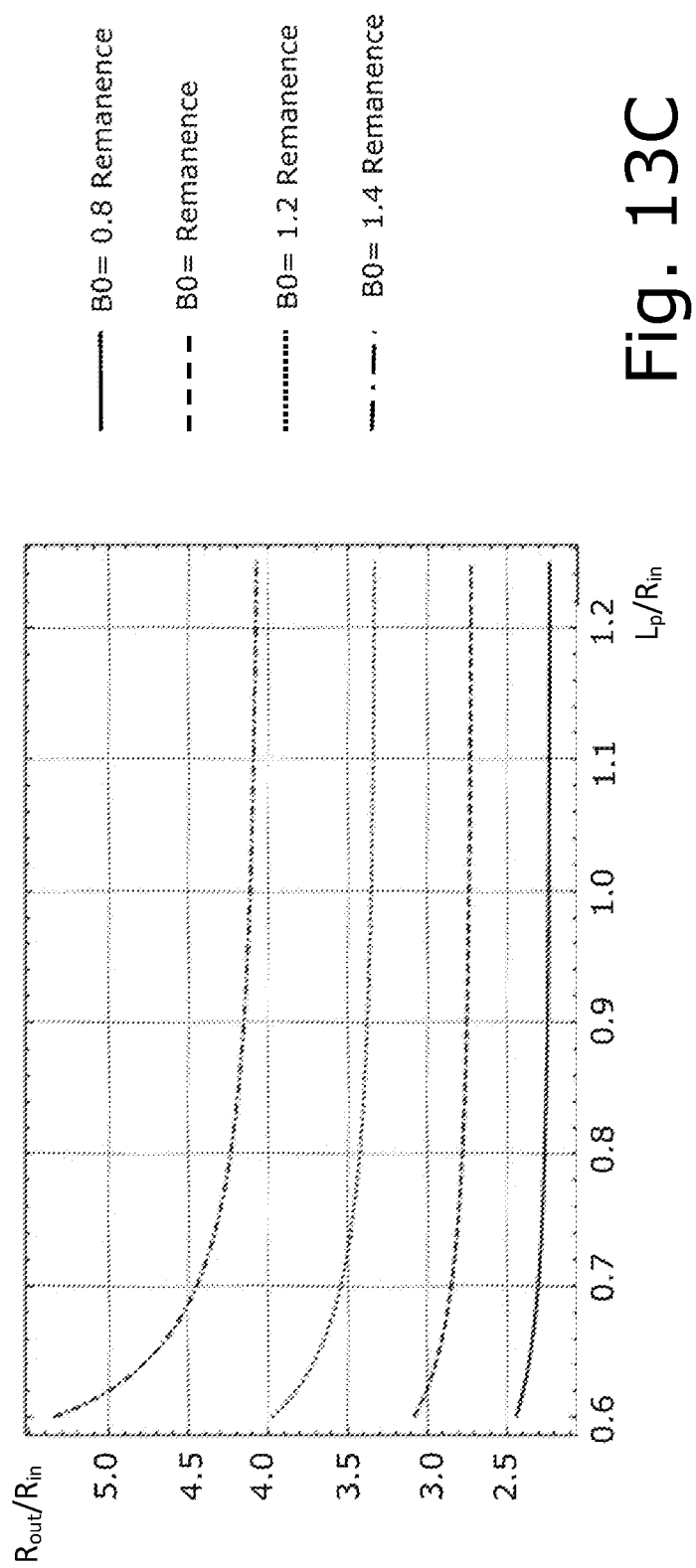
FIG. 13C shows the normalized outer radius of the magnet element $R_{out}/R_{in}$ as a function of the normalized plateau length $L_p/R_{in}$ for estimating the required structural size of the magnet element and for illustrating the weak dependence of outer radius and plateau length in the case of various remanences.
Figure 13D:
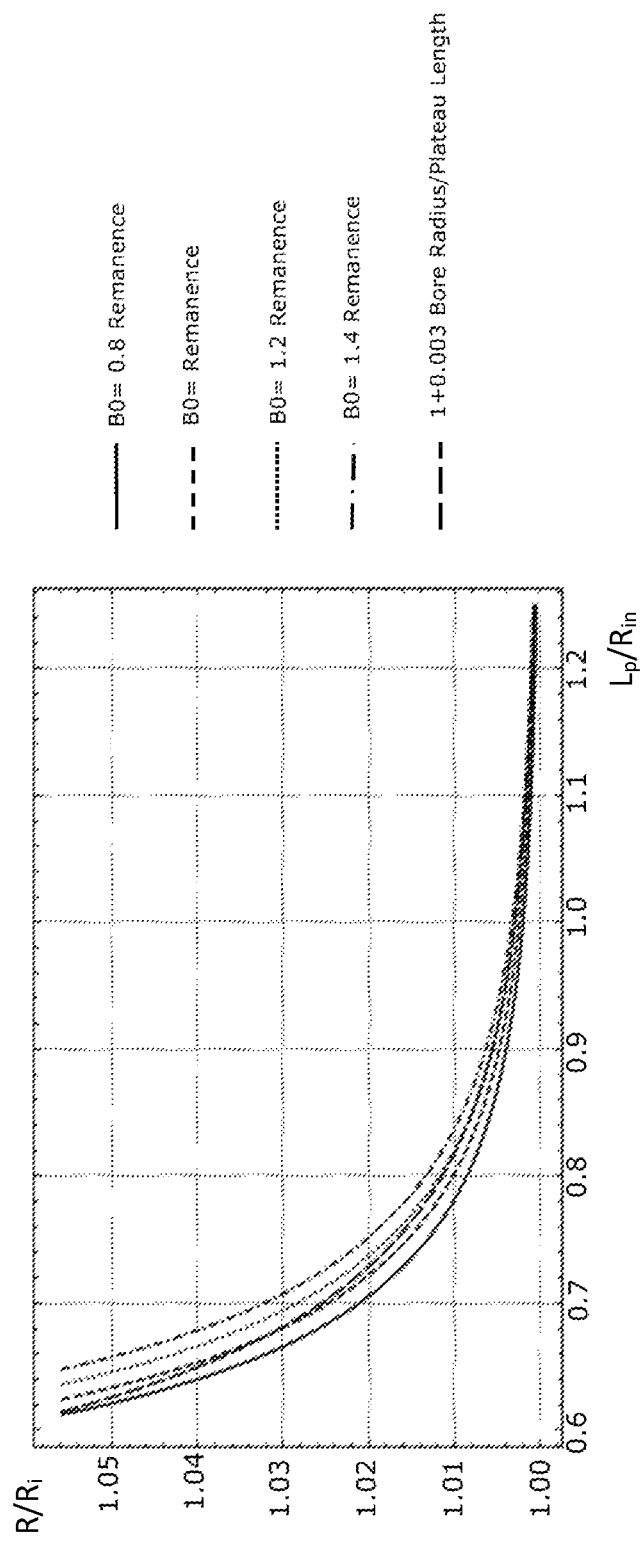
FIG. 13D shows the normalized outer radius of the circumferential cutout $R_{out}/R_{in}$ as a function of the normalized plateau length $L_p/R_{in}$ in the case of various remanences for illustrating the weak dependencies of field and plateau length.

The graph in FIG. 13B shows the resulting normalized notch length $L_z/R_{in}$ and the graph in FIG. 13D shows the resulting normalized notch radius $R/R_{in}$. It is accordingly advantageous if the length of the notched cutout is approximately 1.5 times the bore radius.

FIG. 13C shows the normalized outer radius $R_{out}/R_{in}$. It is thereby possible to estimate the structural size. For the example illustrated, the outer radius would have to be approximately 2.8 times the inner radius. It is evident, moreover, that the outer radius is dependent on the axial plateau length $L_P$ only in the range of short plateau lengths and thus for embodiments of short design.

Figure 13E:
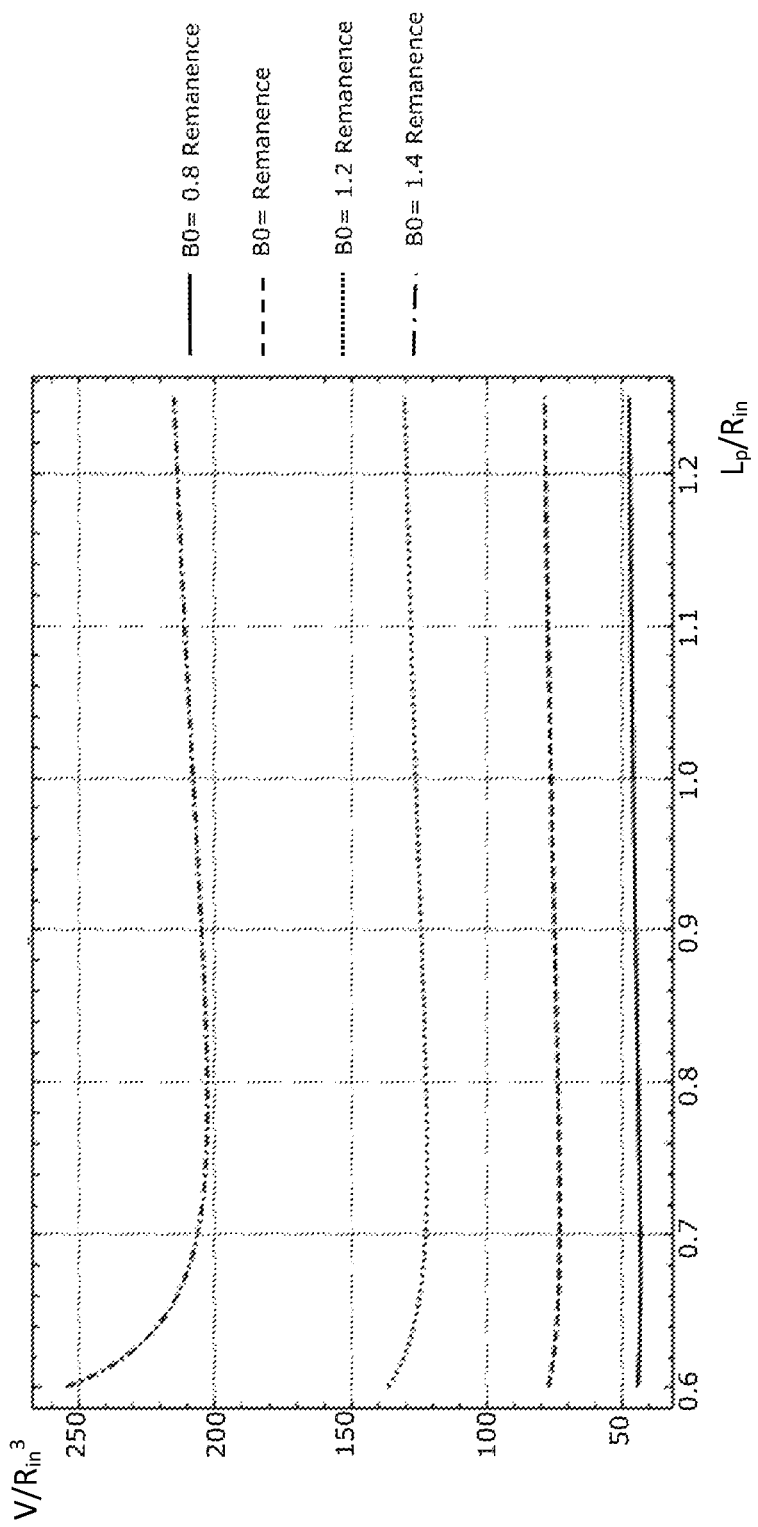
FIG. 13E shows the normalized volume of the magnet element $V/R_{in}^3$ as a function of the normalized plateau length $L_p/R_{in}$ in the case of various remanences for illustrating the increasing dependence of field and plateau length in the case of axially shorter magnet elements and thus the significance of the circumferential notched, hollow-cylindrical cutout according to the invention precisely in the case of a relatively compact magnet design.

Finally, FIG. 13E shows the normalized volume $V/R_{in}^3$. Once again it is possible to discern the increasing dependence for short axial plateau lengths $L_P$ and thus embodiments of the magnet element according to the invention that are of short design.

Moreover, it is evident that the notched cutout is less and less pronounced with increasing length of the magnet and thus also the axial plateau length $L_P$. This is owing to the fact that with increasing length the limiting case of a structure of infinite axial extent is approached again. However, the notch fulfills precisely the purpose of realizing a comparatively short magnet assembly which, in a narrowly delimited section, has the homogeneity that otherwise would be achievable only with a very long assembly.

LIST OF REFERENCE SIGNS

0 Measurement volume
1 Magnet arrangement
2a-2f'' Ring-shaped magnet elements
3a, 3b, 3d, 3' Circumferential notched, hollow-cylindrical cutout
4a, 4a' Central magnet ring
4b', 4b'' Further magnet rings

PHYSICAL VARIABLES x, y, z Cartesian coordinates
$B_0$ Homogeneous magnetic field
N Zonal field terms
$L_{z,M}$ Axial length of the ring-shaped magnet element
$R_{in}$ Inner radius of the ring-shaped magnet element
$R_{out}$ Maximum outer radius of the ring-shaped magnet element
$L_{z,A}$ Axial length of the notched cutout
$T_A$ Radial depth of the notched cutout
$L_P$ Axial plateau length of the homogeneous field region in the measurement volume
$L_P/R_{in}$ Normalized plateau length
$L_M/R_{in}$ Normalized magnet length
$L_z/R_{in}$ Normalized notch length
$R_{out}/R_{in}$ Normalized outer radius of the magnet element
$R/R_{in}$ Normalized outer radius of the circumferential cutout
$V/R_{in}^3$ Normalized volume of the magnet element

LIST OF REFERENCES

Documents taken into consideration for the assessment of patentability
[1] U.S. Pat. No. 4,931,760 A
[2] US 2010/013473 A1
[3] EP 3 217 186 B1
[4] US2015/0061680A1

What is claimed is:

1. A magnet arrangement in a magnetic resonance apparatus having a permanent magnet system for generating a homogeneous magnetic field $B_0$ in a direction perpendicular to a z-axis in a measurement volume, wherein the permanent magnet system comprises at least one hollow-cylindrical ring-shaped magnet element arranged concentrically around the z-axis and composed of magnetic material having an axial length $L_{z,M}$ and an inner radius $R_{in}$,
wherein the ring-shaped magnet element is constructed from individual magnet segments and is arranged to have a Halbach magnetization that generates a magnetic dipole field,
wherein the ring-shaped magnet element has a notched, hollow-cylindrical cutout that extends circumferentially around the z-axis and that is arranged symmetrically with respect to the plane z=0,
wherein the circumferential notched cutout of the ring-shaped magnet element has a radial depth $T_A$ and has an axial length $L_{z,A}<L_{z,M}$ between the z-positions $z=-z_A$ to $z=+z_A$, and
wherein the radial depth $T_A$ and the axial length $L_{z,A}$ of the notched cutout are selected such that, in a predefined measurement volume having an axial plateau length $L_P$ in a center of the magnet arrangement of the magnetic resonance apparatus, a remaining inhomogeneity of the homogenous magnetic field $B_0$ does not exceed 10 ppm.

2. The magnet arrangement as claimed in claim 1, wherein the radial depth $T_A$ and the axial length $L_{z,A}$ of the notched cutout are selected to provide an at least 6th-order Halbach magnet in which all zonal field terms N to N≤8 in the measurement volume of the magnetic resonance apparatus do not exceed a value of 10 ppm.

3. The magnet arrangement as claimed in claim 2, wherein the radial depth $T_A$ and the axial length $L_{z,A}$ of the notched cutout are selected to provide an 8th-order Halbach magnet in which all zonal field terms up to N=10 do not exceed a value of 10 ppm.

4. The magnet arrangement as claimed in claim 2, wherein doubly periodic field orders <N do not exceed a value of 10 ppm.

5. The magnet arrangement as claimed in claim 1, wherein the circumferential notched, hollow-cylindrical cutout is arranged at an inner side of the ring-shaped magnet element facing the z-axis.

6. The magnet arrangement as claimed in claim 1, wherein the circumferential notched, hollow-cylindrical cutout is embodied as a radially inner notch through a separate central magnet ring having an axial length $L_{z,A}$ and an inner radius $R_{in}+T_A$, which is flanked axially on each side respectively by a further magnet ring having an inner radius $R_{in}$.

7. The magnet arrangement as claimed in claim 1, wherein a plurality of ring-shaped magnet elements are arranged concentrically around the z-axis, at least one of which has the notched, hollow-cylindrical cutout extending circumferentially around the z-axis.

8. The magnet arrangement as claimed in claim 7, wherein at least some of the ring-shaped magnet elements are constructed from differing permanent-magnetic materials.

9. The magnet arrangement as claimed in claim 1, wherein a plurality of ring-shaped magnet elements are arranged in a manner stacked one above another in the z-direction, and at least one of the ring-shaped magnet elements has a notched, hollow-cylindrical cutout extending circumferentially around the z-axis.

10. The magnet arrangement as claimed in claim 9, wherein at least some of the ring-shaped magnet elements are constructed from differing permanent-magnetic materials.

11. A method for producing a magnet arrangement as claimed in claim 1, comprising:
(a) predefining a minimum inner radius $R_{in}$ of the magnet arrangement, wherein the radius defines a bore size, as well as a smallest non-vanishing zonal field order N, wherein N is a positive even number, as well as a desired magnetic field strength of the homogenous magnetic field $B_0$ in the center of the magnet arrangement;

(b) designing a ring-shaped magnet element as a basic magnet cylinder in a Halbach configuration comprising predefined magnet material of known remanence, having a maximum outer radius $R_{out}$ and an axial length $L_{z,M}$, wherein a ratio of the outer radius $R_{out}$ to the length of the ring-shaped magnet element $R_{out}/L_{z,M}$ is from 10:1 to 1:10, such that the magnetic field strength $B_0$ is attained in the center as a target magnetic field strength;

(c) detecting the resulting magnetic field profile in the region of the measurement volume by determining the values of the zonal magnetic field orders of the basic magnet cylinder up to at least the N-th order;

(d) computationally arranging at least one circumferential notched, hollow-cylindrical cutout in the basic magnet cylinder symmetrically with respect to the plane z=0 with a lower remanence and calculating the radial depth $T_A$ and the axial length $L_{z,A} < L_{z,M}$ between the z-positions z=−$z_A$ to z=+$z_A$ and with $L_N$ such that a sum of the zonal magnetic field orders with order less than N vanishes in the basic magnet cylinder modified by the cutout; and (e) adapting the magnetic field strength generated by the modified basic magnet cylinder in the center of the magnet arrangement to the desired magnetic field strength $B_0$ by altering the outer radius $R_{out}$ and/or the axial length $L_{z,M}$ of the basic magnet cylinder.

12. The method as claimed in claim 11, wherein in step (e) the field strength $B_{OR}$ resulting from step (d) is detected and the target magnetic field strength $B_0$ in the center of the magnet arrangement is adapted by repeating steps (b) to (d) until $B_{OR}=B_0$.

13. The method as claimed in claim 11, further comprising constructing the ring-shaped magnet element computationally from at least N+2 circle-arc-shaped magnet segments.

14. The method as claimed in claim 11, wherein the circumferential notched, hollow-cylindrical cutout is arranged radially on the inside in the basic magnet cylinder, and wherein the outer radius $R_{out,A}$ and the inner radius $R_{in,A}$ of the cutout satisfy the following proportionality condition: $(R_{in,A}+R_{out,A})/(R_{in,A}) \sim 1+0.003*((R_{in,A})/(L_P))^N$, wherein $L_P$ denotes the plateau length of the measurement volume (0) in the center of the magnet arrangement, which is the axial length of the measurement volume.

15. The method as claimed in claim 11, wherein the circumferential notched, hollow-cylindrical cutout is realized in the basic magnet cylinder in a separate central magnet ring having an axial length $L_{z,A}$ and an inner radius $R_{in}+T_A$, such that the magnet arrangement comprises at least three individual rings arranged coaxially along the z-axis.

16. The method as claimed in claim 13, wherein the circumferential notched, hollow-cylindrical cutout is realized in the basic magnet cylinder in a separate central magnet ring having an axial length $L_{z,A}$ and an inner radius $R_{in}+T_A$, such that the magnet arrangement comprises at least three individual rings arranged coaxially along the z-axis, and wherein the magnet segments, which are circle-arc-shaped, firstly are adhesively bonded to form fixed individual rings and are stacked one above another in the z-direction and, for further homogenization of the magnetic field, the separate central magnet ring is displaced in an x-y-plane perpendicular to the z-direction.

17. The method as claimed in claim 16, wherein, for further homogenization of the magnetic field, the axially outer magnet rings are rotated and/or tilted relative to one another about the z-axis.

* * * * *